US012332416B2

(12) United States Patent
Cornelissen et al.

(10) Patent No.: US 12,332,416 B2
(45) Date of Patent: Jun. 17, 2025

(54) LASER SMD PACKAGE WITH PHOSPHOR AND LIGHT INCOUPLER

(71) Applicant: SIGNIFY HOLDING B.V., Eindhoven (NL)

(72) Inventors: Hugo Johan Cornelissen, Escharen (NL); Ties Van Bommel, Horst (NL)

(73) Assignee: SIGNIFY HOLDING, B.V., Eindhoven (NL)

( * ) Notice: Subject to any disclaimer, the term of this patent is extended or adjusted under 35 U.S.C. 154(b) by 192 days.

(21) Appl. No.: 18/265,159

(22) PCT Filed: Nov. 26, 2021

(86) PCT No.: PCT/EP2021/083166
§ 371 (c)(1),
(2) Date: Jun. 2, 2023

(87) PCT Pub. No.: WO2022/117455
PCT Pub. Date: Jun. 9, 2022

(65) Prior Publication Data
US 2023/0408802 A1 Dec. 21, 2023

(30) Foreign Application Priority Data

Dec. 4, 2020 (EP) .................................. 20211784

(51) Int. Cl.
*F21K 9/64* (2016.01)
*F21V 9/32* (2018.01)
(Continued)

(52) U.S. Cl.
CPC ............ *G02B 19/0052* (2013.01); *F21K 9/64* (2016.08); *F21V 9/32* (2018.02); *F21V 13/08* (2013.01);
(Continued)

(58) Field of Classification Search
CPC ............ F21Y 2107/40; F21Y 2107/90; F21Y 2113/00; F21Y 115/30; F21V 7/00;
(Continued)

(56) References Cited

U.S. PATENT DOCUMENTS 10,215,367 B2 * 2/2019 Adema .................... F21V 5/008
10,281,100 B2 * 5/2019 Courcier ................. F21S 43/40
(Continued)

FOREIGN PATENT DOCUMENTS

DE 10349038 A1 5/2004
DE 102008012316 A1 4/2009
(Continued)

*Primary Examiner* — William J Carter

(57) ABSTRACT

The invention provides a light generating system (1000) comprising a lighting unit (100), a luminescent element (210), an optical element (400), and a reflective element (510), wherein: (a) the lighting unit (100) is configured to generate a beam (102) of unit light (101); (b) the luminescent element (210) comprises a luminescent material (200) configured to convert at least part of the unit light (101) into luminescent material light (201); wherein the luminescent element (210) comprises a first luminescent element face (211) and a second luminescent element face (212), wherein at least part of the luminescent material (200) is configured between the first luminescent element face (211) and the second luminescent element face (212); (c) the optical element (400) comprises an external surface (410), wherein the optical element (400) is configured between the luminescent element (210) and 10 the reflective element (510), wherein a first part (421) of the external surface (410) is directed to the second luminescent face (212), wherein a second part (422) of the external surface (410) is directed to the reflective element (510), and wherein a third part (423) of the externa surface (410) is configured in a light receiving relationship with the lighting unit (100); wherein a first area A1 of the first part (421) is smaller than a second area A2 of (Continued)

the second part (422), wherein the optical element (400) is transmissive for the unit light (101); (d) the reflective element (510) is configured to reflect unit light (101); and (e) the lighting unit (100) is configured such that in an operational mode the lighting unit (100) is configured to irradiate the first element face (211) via transmission through the optical element (400) and reflection at the reflective element (510).

15 Claims, 6 Drawing Sheets

(51) Int. Cl.
    *F21V 13/08*      (2006.01)
    *F21Y 115/30*      (2016.01)
    *G02B 19/00*      (2006.01)

(52) U.S. Cl.
    CPC ..... *G02B 19/0028* (2013.01); *G02B 19/0061* (2013.01); *F21Y 2115/30* (2016.08)

(58) Field of Classification Search
    CPC .. F21V 13/14; F21V 9/32; F21V 13/08; F21S 41/176; F21S 41/30; F21S 41/365; F21K 9/64
    See application file for complete search history.

(56) References Cited

U.S. PATENT DOCUMENTS

| | | | |
|---|---|---|---|
| 2013/0208478 A1* | 8/2013 | Bowden | F21V 9/38 362/260 |
| 2015/0016142 A1* | 1/2015 | Chang | A61B 1/00 362/583 |
| 2015/0167905 A1* | 6/2015 | Khrushchev | F21V 7/06 362/84 |
| 2015/0354761 A1* | 12/2015 | Nagao | F21V 9/30 362/510 |
| 2020/0011506 A1 | 1/2020 | Mao et al. | |

FOREIGN PATENT DOCUMENTS

| | | |
|---|---|---|
| DE | 102016104616 A1 | 9/2017 |
| WO | 2019008092 A1 | 1/2019 |
| WO | 2020019085 A9 | 3/2020 |

\* cited by examiner

ND LIGHT INCOUPLER

LASER SMD PACKAGE WITH PHOSPHOR AND LIGHT INCOUPLER

CROSS-REFERENCE TO PRIOR APPLICATIONS

This application is the U.S. National Phase application under 35 U.S.C. § 371 of International Application No. PCT/EP2021/083166, filed on Nov. 26, 2021, which claims the benefit of European Patent Application No. 20211784.2, filed on Dec. 4, 2020. These applications are hereby incorporated by reference herein.

FIELD OF THE INVENTION

The invention relates to a light generating system, an integrated light source package comprising the light generating system, and a light generating device comprising the light generating system.

BACKGROUND OF THE INVENTION

Light sources, such as laser light sources, are known in the art. US20180316160, for instance, describes an integrated white light source comprising: a laser diode device comprising a gallium and nitrogen containing material and configured as an excitation source; a phosphor member configured as a wavelength converter and an emitter and coupled to the laser diode device; a common support member configured to support the laser diode device and the phosphor member, a heat sink thermally coupled to the common support member, the common support member configured to transport thermal energy from the laser diode device and phosphor member to the heat sink; an output facet configured on the laser diode device to output a laser beam comprised of electromagnetic radiation selected from a violet and/or a blue emission with a first wavelength ranging from 400 nm to 485 nm; a free space, between the output facet and the phosphor member with a non-guided characteristic capable of transmitting the laser beam from the laser diode device to an excitation surface of the phosphor member; a range of angles of incidence between the laser beam and the excitation surface of the phosphor member so that on average the laser beam has an off-normal incidence to the excitation surface and a beam spot is configured for a certain geometrical size and shape; wherein the phosphor member converts a fraction of the electromagnetic radiation from the laser beam with the first wavelength to an emitted electromagnetic radiation with a second wavelength that is longer than the first wavelength; a plurality of scattering centers associated with the phosphor member to scatter electromagnetic radiation with the first wavelength from the laser beam incident on the phosphor member; a reflective mode characterizing the phosphor member such that the laser beam is incident on a beam spot area on the excitation surface of the phosphor member and a white light emission is outputted substantially from the same beam spot area, the white light emission being comprised of a mixture of wavelengths characterized by at least the second wavelength emitted electromagnetic radiation from the phosphor member; and a form factor characterizing a package of the integrated white light source, the form factor having a length, a width, and a height dimension.

DE10201616A1 discloses a semiconductor lighting device that includes at least one semiconductor laser configured to generate a primary radiation and at least one conversion element configured to generate a longer-wave visible secondary radiation from the primary radiation, wherein the conversion element includes a semiconductor layer sequence having one or more quantum well layers, wherein the semiconductor layer sequence is homogeneously illuminated with the primary radiation. The growth substrate of the semiconductor layer sequence is located between the semiconductor layer sequence and the semiconductor laser, the growth substrate being oriented perpendicular to the growth direction.

DE102008012316A1 discloses a semiconductor light source having a primary radiation source which emits electromagnetic primary radiation in a first wavelength range, and having a luminescence conversion module into which primary radiation emitted by the primary radiation source is fed. The luminescence conversion module contains a luminescence conversion element which absorbs primary radiation from the first wavelength range and emits electromagnetic secondary radiation in a second wavelength range. The luminescence conversion element is arranged on a heat sink at a distance from the primary radiation source. It has a reflector surface which reflects back into the luminescence conversion element the primary radiation which passes through the luminescence conversion element and that is not absorbed thereby and/or reflects secondary radiation in the direction of a light coupling-out surface of the luminescence conversion element.

WO2019/008092A1 discloses a lighting device comprising a luminescent element comprising an elongated light transmissive body, the elongated light transmissive body comprising a side face, wherein the elongated light transmissive body comprises a luminescent material configured to convert at least part of a light source light selected from one or more of the UV, visible light, and IR received by the elongated light transmissive body into luminescent material radiation.

DE10349038A1 discloses a light source, having at least one LED for emitting a blue primary radiation and at least one luminescence conversion body having at least one luminescent material for converting the primary radiation into a secondary radiation. The luminescence conversion body is a polycrystalline ceramic body. The ceramic body comprises a luminescent material based on a cerium-doped yttrium aluminum garnet emitting yellow secondary radiation. Blue primary radiation and yellow secondary radiation penetrate through the luminescence conversion body and are perceived as white light by the observer.

SUMMARY OF THE INVENTION

While white LED sources can give an intensity of e.g. up to about 300 1 m/mm$^2$; static phosphor converted laser white sources can give an intensity even up to about 2. Ce doped garnets (e.g. YAG, LuAG) may be the most suitable luminescent convertors which can be used for pumping with blue laser light as the garnet matrix has a very high chemical stability. Further, at low Ce concentrations (e.g. below 0.5%) temperature quenching may only occur above about 200° C. Furthermore, emission from Ce has a very fast decay time so that optical saturation can essentially be avoided. Assuming e.g. a reflective mode operation, blue laser light may be incident on a phosphor. This may in embodiments realize almost full conversion of blue light, leading to emission of converted light. It is for this reason that the use of garnet phosphors with relatively high stability and thermal conductivity is suggested. However, also other phosphors may be applied. Heat management may remain an issue when extremely high-power densities are used.

High brightness light sources can be used in applications such as projection, stage-lighting, spot-lighting and automotive lighting. For this purpose, laser-phosphor technology can be used wherein a laser provides laser light and e.g. a (remote) phosphor converts laser light into converted light. The phosphor may in embodiments be arranged on or inserted in a heatsink for improved thermal management and thus higher brightness.

One of the problems that may be associated with such (laser) light sources is the heat management of the ceramic phosphor. Other problems associated with such laser light sources may be the desire to create compact high power devices, which may not always be relatively easy.

Hence, it is an aspect of the invention to provide an alternative light generating system, which preferably further at least partly obviates one or more of above-described drawbacks. The present invention may have as object to overcome or ameliorate at least one of the disadvantages of the prior art, or to provide a useful alternative.

Especially, in an aspect the invention provides a light generating system comprising a lighting unit, a luminescent element (or "luminescent material element"), an optical element, and a reflective element. In embodiments, the lighting unit may especially be configured to generate a beam of unit light. Further, the luminescent element especially comprises a luminescent material. In embodiments, the luminescent material may be configured to convert at least part of the unit light into luminescent material light. Especially, in embodiments the luminescent element may comprise a first luminescent element face and a second luminescent element face. Especially, at least part of the luminescent material may be configured between the first luminescent element face and the second luminescent element face. Further, in embodiments the optical element may comprise an external surface. Especially, in embodiments the optical element may be configured between the luminescent element and the reflective element. Further, in embodiments a first part of the external surface of the optical element may be directed to the second luminescent face. Yet further, in embodiments a second part of the external surface of the optical element may be directed to the reflective element. Especially, in embodiments a third part of the external surface may be configured in a light receiving relationship with the lighting unit. Especially, in embodiments a first area A1 of the first part of the external surface of the optical element may be smaller than a second area A2 of the second part of the external surface of the optical element. Especially, in embodiments the optical element may be transmissive for the unit light. In embodiments, the reflective element may be configured to reflect unit light. Especially, in embodiments the lighting unit may be configured such that in an operational mode the lighting unit is configured to irradiate the first luminescent element face via transmission through the optical element and reflection at the reflective element. Hence, in specific embodiments the invention provides a light generating system comprising a lighting unit, a luminescent element, an optical element, and a reflective element, wherein: (a) the lighting unit is configured to generate a beam of unit light; (b) the luminescent element comprises a luminescent material configured to convert at least part of the unit light into luminescent material light; wherein the luminescent element comprises a first luminescent element face and a second luminescent element face, wherein at least part of the luminescent material is configured between the first luminescent element face and the second luminescent element face; (c) the optical element comprises an external surface, wherein the optical element is configured between the luminescent element and the reflective element, wherein a first part of the external surface is directed to the second luminescent face, wherein a second part of the external surface is directed to the reflective element, and wherein a third part of the externa surface is configured in a light receiving relationship with the lighting unit; wherein a first area A1 of the first part is smaller than a second area A2 of the second part, wherein the optical element is transmissive for the unit light; (d) the reflective element is configured to reflect unit light; and (e) the lighting unit is configured such that in an operational mode the lighting unit is configured to irradiate the first element face via transmission through the optical element and reflection at the reflective element. Hence, in specific embodiments the invention provides a solid state light source, such as a laser, SMD (surface mounted device) package with a transmissive luminescent element.

With such light generating system, thermal management may be easier, as the light from the light sources may be distributed over the surface of the luminescent element. Further, heat may dissipate via the optical element to a thermally conductive element, like a reflective heatsink. Further, the light generating system may allow relatively high intensities as the luminescent material may be pumped with a plurality of lighting units.

As indicated above, the light generating system may especially comprise a lighting unit, a luminescent element, an optical element, and a reflective element. Embodiments of the lighting unit, a luminescent element, an optical element, and a reflective element are described below. Further, embodiments of the light generating system are described below.

Further, as indicated above the light generating system comprises a lighting unit. The term "lighting unit" may in embodiments also refer to a plurality of lighting units. In general, the number of lighting units which may be configured to provide unit light to the luminescent element may be selected from the range of 1-64, such as 1-24, like in embodiments 2-16. However, larger numbers may also be possible, such as selected from the range of 4-50.

The term "light source" may in principle relate to any light source known in the art. It may be a conventional (tungsten) light bulb, a low pressure mercury lamp, a high pressure mercury lamp, a fluorescent lamp, a LED (light emissive diode). In a specific embodiment, the light source comprises a solid state LED light source (such as a LED or laser diode (or "diode laser")). The term "light source" may also relate to a plurality of light sources, such as 2-200 (solid state) LED light sources. Hence, the term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of light semiconductor light source may be configured on the same substrate. In embodiments, a COB is a multi LED chip configured together as a single lighting module.

The light source has a light escape surface. Referring to conventional light sources such as light bulbs or fluorescent lamps, it may be outer surface of the glass or quartz envelope. For LED's it may for instance be the LED die, or when a resin is applied to the LED die, the outer surface of the resin. In principle, it may also be the terminal end of a fiber. The term escape surface especially relates to that part of the light source, where the light actually leaves or escapes from the light source. The light source is configured to provide a beam of light. This beam of light (thus) escapes from the light exit surface of the light source.

The term "light source" may refer to a semiconductor light-emitting device, such as a light emitting diode (LEDs), a resonant cavity light emitting diode (RCLED), a vertical cavity laser diode (VCSELs), an edge emitting laser, etc. . . . The term "light source" may also refer to an organic light-emitting diode, such as a passive-matrix (PMOLED) or an active-matrix (AMOLED). In a specific embodiment, the light source comprises a solid-state light source (such as a LED or laser diode). In an embodiment, the light source comprises a LED (light emitting diode). The terms "light source" or "solid state light source" may also refer to a superluminescent diode (SLED).

The term LED may also refer to a plurality of LEDs. Further, the term "light source" may in embodiments also refer to a so-called chips-on-board (COB) light source. The term "COB" especially refers to LED chips in the form of a semiconductor chip that is neither encased nor connected but directly mounted onto a substrate, such as a PCB. Hence, a plurality of semiconductor light sources may be configured on the same substrate. In embodiments, a COB is a multi LED chip configured together as a single lighting module.

The term "light source" may also relate to a plurality of (essentially identical (or different)) light sources, such as 2-2000 solid state light sources. In embodiments, the light source may comprise one or more micro-optical elements (array of micro lenses) downstream of a single solid-state light source, such as a LED, or downstream of a plurality of solid-state light sources (i.e. e.g. shared by multiple LEDs). In embodiments, the light source may comprise a LED with on-chip optics. In embodiments, the light source comprises a pixelated single LEDs (with or without optics) (offering in embodiments on-chip beam steering).

In embodiments, the light source may be configured to provide primary radiation, which is used as such, such as e.g. a blue light source, like a blue LED, or a green light source, such as a green LED, and a red light source, such as a red LED. Such LEDs, which may not comprise a luminescent material ("phosphor") may be indicated as direct color LEDs.

In other embodiments, however, the light source may be configured to provide primary radiation and part of the primary radiation is converted into secondary radiation. Secondary radiation may be based on conversion by a luminescent material. The secondary radiation may therefore also be indicated as luminescent material radiation. The luminescent material may in embodiments be comprised by the light source, such as a LED with a luminescent material layer or dome comprising luminescent material. Such LEDs may be indicated as phosphor converted LEDs or PC LEDs. In other embodiments, the luminescent material may be configured at some distance ("remote") from the light source, such as a LED with a luminescent material layer not in physical contact with a die of the LED. Hence, in specific embodiments the light source may be a light source that during operation emits at least light at wavelength selected from the range of 380-470 nm. However, other wavelengths may also be possible. This light may partially be used by the luminescent material.

The term "laser light source" especially refers to a laser. Such laser may especially be configured to generate laser light source light having one or more wavelengths in the UV, visible, or infrared, especially having a wavelength selected from the spectral wavelength range of 200-2000 nm, such as 300-1500 nm. The term "laser" especially refers to a device that emits light through a process of optical amplification based on the stimulated emission of electromagnetic radiation.

Especially, in embodiments the term "laser" may refer to a solid-state laser. In specific embodiments, the terms "laser" or "laser light source", or similar terms, refer to a laser diode (or diode laser).

Hence, in embodiments the light source comprises a laser light source. In embodiments, the terms "laser" or "solid state laser" may refer to one or more of cerium doped lithium strontium (or calcium) aluminum fluoride (Ce:LiSAF, Ce:LiCAF), chromium doped chrysoberyl (alexandrite) laser, chromium ZnSe (Cr:ZnSe) laser, divalent samarium doped calcium fluoride ($Sm:CaF_2$) laser, Er:YAG laser, erbium doped and erbium-ytterbium codoped glass lasers, F-Center laser, holmium YAG (Ho:YAG) laser, Nd:YAG laser, NdCrYAG laser, neodymium doped yttrium calcium oxoborate $Nd:YCa_4O(BO_3)_3$ or Nd:YCOB, neodymium doped yttrium orthovanadate ($Nd:YVO_4$) laser, neodymium glass (Nd:glass) laser, neodymium YLF (Nd:YLF) solid-state laser, promethium 147 doped phosphate glass ($147Pm^{3+}$:glass) solid-state laser, ruby laser ($Al_2O_3$:$Cr^{3+}$), thulium YAG (Tm:YAG) laser, titanium sapphire (Ti:sapphire; $Al_2O_3$:$Ti^{3+}$) laser, trivalent uranium doped calcium fluoride ($U:CaF_2$) solid-state laser, Ytterbium doped glass laser (rod, plate/chip, and fiber), Ytterbium YAG (Yb:YAG) laser, $Yb_2O_3$ (glass or ceramics) laser, etc.

In embodiments, the terms "laser" or "solid state laser" may refer to one or more of a semiconductor laser diode, such as GaN, InGaN, AlGaInP, AlGaAs, InGaAsP, lead salt, vertical cavity surface emitting laser (VCSEL), quantum cascade laser, hybrid silicon laser, etc.

A laser (or other light source) may be combined with an upconverter in order to arrive at shorter (laser) wavelengths. For instance, with some (trivalent) rare earth ions upconversion may be obtained or with non-linear crystals upconversion can be obtained. Alternatively, a laser can be combined with a downconverter, such as a dye laser, to arrive at longer (laser) wavelengths.

As can be derived from the below, the term "laser light source" may also refer to a plurality of (different or identical) laser light sources. In specific embodiments, the term "laser light source" may refer to a plurality N of (identical) laser light sources. In embodiments, N=2, or more. In specific embodiments, N may be at least 5, such as especially at least 8. In this way, a higher brightness may be obtained. In embodiments, laser light sources may be arranged in a laser bank (see also above). The laser bank may in embodiments comprise heat sinking and/or optics e.g. a lens to collimate the laser light.

The laser light source is configured to generate laser light source light (or "laser light"). The light source light may essentially consist of the laser light source light. The light source light may also comprise laser light source light of two or more (different or identical) laser light sources. For instance, the laser light source light of two or more (different or identical) laser light sources may be coupled into a light guide, to provide a single beam of light comprising the laser light source light of the two or more (different or identical) laser light sources. In specific embodiments, the light source light is thus especially collimated light source light. In yet further embodiments, the light source light is especially (collimated) laser light source light.

The phrases "different light sources" or "a plurality of different light sources", and similar phrases, may in embodiments refer to a plurality of solid-state light sources selected from at least two different bins. Likewise, the phrases "identical light sources" or "a plurality of same light sources", and similar phrases, may in embodiments refer to a plurality of solid-state light sources selected from the same bin.

The light source is especially configured to generate light source light having an optical axis (O), (a beam shape) and a spectral power distribution. The light source light may in embodiments comprise one or more bands, having band widths as known for lasers. In specific embodiments, the band(s) may be relatively sharp line(s), such as having full width half maximum (FWHM) in the range of less than 20 nm at RT, such as equal to or less than 10 nm. Hence, the light source light has a spectral power distribution (intensity on an energy scale as function of the wavelength) which may comprise one or more (narrow) bands.

The beams (of light source light) may be focused or collimated beams of (laser) light source light. The term "focused" may especially refer to converging to a small spot. This small spot may be at the discrete converter region, or (slightly) upstream thereof or (slightly) downstream thereof. Especially, focusing and/or collimation may be such that the cross-sectional shape (perpendicular to the optical axis) of the beam at the discrete converter region (at the side face) is essentially not larger than the cross-section shape (perpendicular to the optical axis) of the discrete converter region (where the light source light irradiates the discrete converter region). Focusing may be executed with one or more optics, like (focusing) lenses. Especially, two lenses may be applied to focus the laser light source light. Collimation may be executed with one or more (other) optics, like collimation elements, such as lenses and/or parabolic mirrors. In embodiments, the beam of (laser) light source light may be relatively highly collimated, such as in embodiments ≤2° (FWHM), more especially ≤1° (FWHM), most especially ≤0.5° (FWHM). Hence, ≤2° (FWHM) may be considered (highly) collimated light source light. Optics may be used to provide (high) collimation (see also above).

Hence, the lighting unit may comprise a light source, and optionally optics. Therefore, in embodiments the lighting unit may essentially consist of a light source. In other embodiments, however, the lighting unit comprises optics. In embodiments, the light source may be selected from the group of laser diodes and superluminescent LEDs.

The lighting unit is especially configured to generate a beam of unit light. Assuming a diode laser, this beam may be a relatively broad beam. Hence, collimating or focusing optics may be used. However, this is not necessarily the case.

The beam of light is used to irradiate the luminescent material. However, this is done in an indirect way via the optical element and the reflector. First some embodiments of the luminescent element is discussed below and thereafter some embodiments of the optical element and of the reflector.

The luminescent element comprises a luminescent material. The luminescent element may be a layer or a body. The luminescent element may comprise a single crystal, a ceramic body, or a glass body. The luminescent element may comprise a polymeric body. The luminescent material may form the body or may be embedded in the body. The layer may comprise the luminescent material and other material, but may especially essentially consist of the luminescent material. In specific embodiments, the luminescent element comprises a luminescent body.

The luminescent element may in embodiments be indicated as "tile" or as "phosphor tile". The luminescent body may especially have the shape of a (small) plate. In embodiments, the body has lateral dimensions width or length (W or L) or diameter (D) and a thickness or height (H). In embodiments, (i) D≥H or (ii) and W≥H and/or L≥H. The luminescent tile may be transparent or light scattering. In embodiments, the tile may comprise a ceramic luminescent material. In specific embodiments, L≤10 mm, such as especially L≤5 mm, more especially L≤3 mm, most especially L≤2 mm. In specific embodiments, W≤10 mm, such as especially W≤5 mm, more especially W≤3 mm, most especially W≤2 mm. In specific embodiments, H≤10 mm, such as especially H≤5 mm, more especially H≤3 mm, most especially H≤2 mm. In specific embodiments, D≤10 mm, such as especially D≤5 mm, more especially D≤3 mm, most especially D≤2 mm. In specific embodiments, the body may have in embodiments a thickness in the range 50 μm-1 mm. Further, the body may have lateral dimensions (width/diameter) in the range 100 μm-10 mm. In yet further specific embodiments, (i) D>H or (ii) W>H and W>H. Especially, the lateral dimensions like length, width, and diameter are at least 2 times, like at least 5 times, larger than the height. Herein, the height of the luminescent body is also indicated with H1.

The luminescent element may comprise a first luminescent element face (or first element face) and a second luminescent element face, wherein at least part of the luminescent material is configured between the first luminescent element face and the second luminescent element face. The first luminescent element face and the second luminescent element face may especially be configured parallel.

The first luminescent element face may also be indicated as top face. In operation, when the luminescent element is irradiated with the unit light, the luminescence (luminescent material light) may especially escape from the luminescent element via the first luminescent element face. The second luminescent element face may also be indicated as bottom face. In operation, when the luminescent element is irradiated with the unit light, via the optical element, at least part of the unit light escaping from the optical element may enter the luminescent element via the second luminescent element face.

As indicated above, the luminescent element may consist of the luminescent material. The term "luminescent material" especially refers to a material that can convert first radiation, especially one or more of UV radiation and blue radiation, into second radiation. In general, the first radiation and second radiation have different spectral power distributions. Hence, instead of the term "luminescent material", also the terms "luminescent converter" or "converter" may be applied. In general, the second radiation has a spectral power distribution at larger wavelengths than the first radiation, which is the case in the so-called down-conversion. In specific embodiments, however the second radiation has a spectral power distribution with intensity at smaller wavelengths than the first radiation, which is the case in the so-called up-conversion.

In embodiments, the "luminescent material" may especially refer to a material that can convert radiation into e.g. visible and/or infrared light. For instance, in embodiments the luminescent material may be able to convert one or more of UV radiation and blue radiation, into visible light. The luminescent material may in specific embodiments also convert radiation into infrared radiation (IR). Hence, upon excitation with radiation, the luminescent material emits radiation. In general, the luminescent material will be a down converter, i.e. radiation of a smaller wavelength is converted into radiation with a larger wavelength ($\lambda_{ex}<\lambda_{em}$), though in specific embodiments the luminescent material may comprise up-converter luminescent material, i.e. radiation of a larger wavelength is converted into radiation with a smaller wavelength ($\lambda_{ex} < \lambda_{em}$).

In embodiments, the term "luminescence" may refer to phosphorescence. In embodiments, the term "luminescence" may also refer to fluorescence. Instead of the term "luminescence", also the term "emission" may be applied. Hence, the terms "first radiation" and "second radiation" may refer to excitation radiation and emission (radiation), respectively. Likewise, the term "luminescent material" may in embodiments refer to phosphorescence and/or fluorescence. The term "luminescent material" may also refer to a plurality of different luminescent materials. Examples of possible luminescent materials are indicated below.

In embodiments, luminescent materials are selected from garnets and nitrides, especially doped with trivalent cerium or divalent europium, respectively. The term "nitride" may also refer to oxynitride or nitridosilicate, etc.

In specific embodiments the luminescent material comprises a luminescent material of the type $A_3B_5O_{12}$:Ce, wherein A in embodiments comprises one or more of Y, La, Gd, Tb and Lu, especially (at least) one or more of Y, Gd, Tb and Lu, and wherein B in embodiments comprises one or more of Al, Ga, In and Sc. Especially, A may comprise one or more of Y, Gd and Lu, such as especially one or more of Y and Lu. Especially, B may comprise one or more of Al and Ga, more especially at least Al, such as essentially entirely Al. Hence, especially suitable luminescent materials are cerium comprising garnet materials. Embodiments of garnets especially include $A_3B_5O_{12}$ garnets, wherein A comprises at least yttrium or lutetium and wherein B comprises at least aluminum. Such garnets may be doped with cerium (Ce), with praseodymium (Pr) or a combination of cerium and praseodymium; especially however with Ce. Especially, B comprises aluminum (Al), however, B may also partly comprise gallium (Ga) and/or scandium (Sc) and/or indium (In), especially up to about 20% of Al, more especially up to about 10% of Al (i.e. the B ions essentially consist of 90 or more mole % of Al and 10 or less mole % of one or more of Ga, Sc and In); B may especially comprise up to about 10% gallium. In another variant, B and O may at least partly be replaced by Si and N. The element A may especially be selected from the group consisting of yttrium (Y), gadolinium (Gd), terbium (Tb) and lutetium (Lu). Further, Gd and/or Tb are especially only present up to an amount of about 20% of A. In a specific embodiment, the garnet luminescent material comprises $(Y_{1-x}Lu_x)_3B_5O_{12}$:Ce, wherein x is equal to or larger than 0 and equal to or smaller than 1. The term ":Ce", indicates that part of the metal ions (i.e. in the garnets: part of the "A" ions) in the luminescent material is replaced by Ce. For instance, in the case of $(Y_{1-x}Lu_x)_3Al_5O_{12}$:Ce, part of Y and/or Lu is replaced by Ce. This is known to the person skilled in the art. Ce will replace A in general for not more than 10%; in general, the Ce concentration will be in the range of 0.1 to 4%, especially 0.1 to 2% (relative to A). Assuming 1% Ce and 10% Y, the full correct formula could be $(Y_{0.1}Lu_{0.89}Ce_{0.01})_3Al_5O_{12}$. Ce in garnets is substantially or only in the trivalent state, as is known to the person skilled in the art.

In embodiments, the luminescent material (thus) comprises $A_3B_5O_{12}$ wherein in specific embodiments at maximum 10% of B—O may be replaced by Si—N.

In specific embodiments the luminescent material comprises $(Y_{x1-x2-x3}A'_{x2}Ce_{x3})_3(Al_{y1-y2}B'_{y2})_5O_{12}$, wherein x1+x2+x3=1, wherein x3>0, wherein 0<x2+x3≤0.2, wherein y1+y2=1, wherein 0≤y2≤0.2, wherein A' comprises one or more elements selected from the group consisting of lanthanides, and wherein B' comprises one or more elements selected from the group consisting of Ga, In and Sc. In embodiments, x3 is selected from the range of 0.001-0.1. In the present invention, especially x1>0, such as >0.2, like at least 0.8. Garnets with Y may provide suitable spectral power distributions.

In specific embodiments at maximum 10% of B—O may be replaced by Si—N. Here, B in B—O refers to one or more of Al, Ga, In and Sc (and O refers to oxygen); in specific embodiments B—O may refer to Al—O. As indicated above, in specific embodiments x3 may be selected from the range of 0.001-0.04. Especially, such luminescent materials may have a suitable spectral distribution (see however below), have a relatively high efficiency, have a relatively high thermal stability, and allow a high CRI (in combination with the first light source light and the second light source light (and the optical filter)). Hence, in specific embodiments A may be selected from the group consisting of Lu and Gd. Alternatively or additionally, B may comprise Ga. Hence, in embodiments the luminescent material comprises $(Y_{x1-x2-x3}(Lu, Gd)_{x2}Ce_{x3})_3(Al_{y1-y2}Ga_{y2})_5O_{12}$, wherein Lu and/or Gd may be available. Even more especially, x3 is selected from the range of 0.001-0.1, wherein 0<x2+x3≤0.1, and wherein 0<y2≤0.1. Further, in specific embodiments, at maximum 1% of B—O may be replaced by Si—N. Here, the percentage refers to moles (as known in the art); see e.g. also EP3149108. In yet further specific embodiments, the luminescent material comprises $(Y_{x1-x3}Ce_{x3})_3Al_5O_{12}$, wherein x1+x3=1, and wherein 0<x3≤0.2, such as 0.001-0.1.

In specific embodiments, the light generating device may only include luminescent materials selected from the type of cerium comprising garnets. In even further specific embodiments, the light generating device includes a single type of luminescent materials, such as $(Y_{x1-x2-x3}A'_{x2}Ce_{x3})_3(Al_{y1-y2}B'_{y2})_5O_{12}$. Hence, in specific embodiments the light generating device comprises luminescent material, wherein at least 85 weight %, even more especially at least about 90 wt. %, such as yet even more especially at least about 95 weight % of the luminescent material comprises $(Y_{x1-x2-x3}A'_{x2}Ce_{x3})_3(Al_{y1-y2}B'_{y2})_5O_{12}$. Here, wherein A' comprises one or more elements selected from the group consisting of lanthanides, and wherein B' comprises one or more elements selected from the group consisting of Ga In and Sc, wherein x1+x2+x3=1, wherein x3>0, wherein 0<x2+x3≤0.2, wherein y1+y2=1, wherein 0≤y2≤0.2. Especially, x3 is selected from the range of 0.001-0.1. Note that in embodiments x2=0. Alternatively or additionally, in embodiments y2=0.

In specific embodiments, A may especially comprise at least Y, and B may especially comprise at least Al.

In embodiments, the luminescent material may alternatively or additionally comprise one or more of $M_2Si_5N_8$:$Eu^{2+}$ and/or $MAlSiN_3$:$Eu^{2+}$ and/or $Ca_2AlSi_3O_2N_5$:$Eu^{2+}$, etc., wherein M comprises one or more of Ba, Sr and Ca, especially in embodiments at least Sr. Hence, in embodiments, the luminescent may comprise one or more materials selected from the group consisting of (Ba, Sr, Ca)S:Eu, (Ba, Sr, Ca)AlSiN$_3$:Eu and (Ba, Sr, Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about 0.5 to 10%, more especially in the range of about 0.5 to 5% relative to the cation(s) it replaces. The term ":Eu", indicates that part of the metal ions is replaced by Eu (in these examples by $Eu^{2+}$). For instance, assuming 2% Eu in CaAlSiN$_3$:Eu, the correct formula could be $(Ca_{0.98}Eu_{0.02})$ AlSiN$_3$. Divalent europium will in general replace divalent cations, such as the above divalent alkaline earth cations, especially Ca, Sr or Ba. The material (Ba, Sr, Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Further, the material (Ba, Sr, Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca). Likewise, the material (Ba, Sr, Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca). Eu in the above indicated luminescent materials is substantially or only in the divalent state, as is known to the person skilled in the art.

In embodiments, a red luminescent material may comprise one or more materials selected from the group consisting of (Ba, Sr, Ca)S:Eu, (Ba, Sr, Ca)AlSiN$_3$:Eu and (Ba, Sr, Ca)$_2$Si$_5$N$_8$:Eu. In these compounds, europium (Eu) is substantially or only divalent, and replaces one or more of the indicated divalent cations. In general, Eu will not be present in amounts larger than 10% of the cation; its presence will especially be in the range of about to 10%, more especially in the range of about 0.5 to 5% relative to the cation(s) it replaces. The term ":Eu", indicates that part of the metal ions is replaced by Eu (in these examples by Eu$^{2+}$). For instance, assuming 2% Eu in CaAlSiN$_3$:Eu, the correct formula could be (Ca$_{0.98}$Eu$_{0.02}$)AlSiN$_3$. Divalent europium will in general replace divalent cations, such as the above divalent alkaline earth cations, especially Ca, Sr or Ba.

The material (Ba, Sr, Ca)S:Eu can also be indicated as MS:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Further, the material (Ba, Sr, Ca)$_2$Si$_5$N$_8$:Eu can also be indicated as M$_2$Si$_5$N$_8$:Eu, wherein M is one or more elements selected from the group consisting of barium (Ba), strontium (Sr) and calcium (Ca); especially, M comprises in this compound Sr and/or Ba. In a further specific embodiment, M consists of Sr and/or Ba (not taking into account the presence of Eu), especially 50 to 100%, more especially 50 to 90% Ba and 50 to 0%, especially 50 to 10% Sr, such as Ba$_{1.5}$Sr$_{0.5}$Si$_5$N$_8$:Eu (i.e. 75% Ba; 25% Sr). Here, Eu is introduced and replaces at least part of M, i.e. one or more of Ba, Sr, and Ca.

Likewise, the material (Ba, Sr, Ca)AlSiN$_3$:Eu can also be indicated as MAlSiN$_3$:Eu, wherein M is one or more elements selected from the group consisting of barium (Ba), strontium (Sr) and calcium (Ca); especially, M comprises in this compound calcium or strontium, or calcium and strontium, more especially calcium. Here, Eu is introduced and replaces at least part of M (i.e. one or more of Ba, Sr, and Ca).

Eu in the above indicated luminescent materials is substantially or only in the divalent state, as is known to the person skilled in the art.

Blue luminescent materials may comprise YSO (Y$_2$SiO$_5$:Ce$^{3+}$), or similar compounds, or BAM (BaMgAl$_{10}$O$_{17}$:Eu$^{2+}$), or similar compounds.

The term "luminescent material" herein especially relates to inorganic luminescent materials.

Instead of the term "luminescent material" also the term "phosphor". These terms are known to the person skilled in the art.

Alternatively or additionally, also other luminescent materials may be applied. For instance quantum dots and/or organic dyes may be applied and may optionally be embedded in transmissive matrices like e.g. polymers, like PMMA, or polysiloxanes, etc. etc.

Quantum dots are small crystals of semiconducting material generally having a width or diameter of only a few nanometers. When excited by incident light, a quantum dot emits light of a color determined by the size and material of the crystal. Light of a particular color can therefore be produced by adapting the size of the dots. Most known quantum dots with emission in the visible range are based on cadmium selenide (CdSe) with a shell such as cadmium sulfide (CdS) and zinc sulfide (ZnS). Cadmium free quantum dots such as indium phosphide (InP), and copper indium sulfide (CuInS$_2$) and/or silver indium sulfide (AgInS$_2$) can also be used. Quantum dots show very narrow emission band and thus they show saturated colors. Furthermore the emission color can easily be tuned by adapting the size of the quantum dots. Any type of quantum dot known in the art may be used in the present invention. However, it may be preferred for reasons of environmental safety and concern to use cadmium-free quantum dots or at least quantum dots having a very low cadmium content.

Instead of quantum dots or in addition to quantum dots, also other quantum confinement structures may be used. The term "quantum confinement structures" should, in the context of the present application, be understood as e.g. quantum wells, quantum dots, quantum rods, tripods, tetrapods, or nano-wires, etcetera.

Organic phosphors can be used as well. Examples of suitable organic phosphor materials are organic luminescent materials based on perylene derivatives, for example compounds sold under the name Lumogen® by BASF. Examples of suitable compounds include, but are not limited to, Lumogen® Red F305, Lumogen® Orange F240, Lumogen® Yellow F083, and Lumogen® F170.

Different luminescent materials may have different spectral power distributions of the respective luminescent material light. Alternatively or additionally, such different luminescent materials may especially have different color points (or dominant wavelengths).

As indicated above, other luminescent materials may also be possible. Hence, in specific embodiments the luminescent material is selected from the group of divalent europium containing nitrides, divalent europium containing oxynitrides, divalent europium containing silicates, cerium comprising garnets, and quantum structures. Quantum structures may e.g. comprise quantum dots or quantum rods (or other quantum type particles) (see above). Quantum structures may also comprise quantum wells. Quantum structures may also comprise photonic crystals.

As indicated above, the luminescent material may especially be configured to convert at least part of the unit light into luminescent material light. In specific embodiments (see amongst others also above), the unit light may be blue light and/or UV radiation, and the luminescent material light may comprise visible light, especially one or more of blue, green, yellow, orange, and red light.

The optical element may especially be used, in combination with the reflective element, to (re)distribute the unit light on the luminescent element.

Hence, instead of using a reflective mode, where the luminescent element may be irradiated on the second luminescent element face and luminescent material light may escape from this first luminescent element face, in the present invention especially the luminescent material (element) is configured in the transmissive mode. Hence, the unit light may be provided to the second luminescent element face, via the optical element.

A luminescent material may be configured in the reflective mode or in the transmissive mode. In the transmissive mode, it may be relatively easy to have light source light admixed in the luminescent material light, which may be useful for generating the desirable spectral power distribution. In the reflective mode, thermal management may be improved, as a substantial part of the luminescent material may be in thermal contact with a thermally conductive element, like a heatsink or heat spreader. In the reflective mode, a part of the light source light may in embodiments be reflected by the luminescent material light and may be admixed in the luminescent material light. Herein, the luminescent element is especially configured in the transmissive mode.

The fact that the luminescent element herein may especially be configured (or operated) in the transmissive mode, does not necessarily imply that also unit light is transmitted through the luminescent element.

In embodiments, at least part of the spectral power of the unit light may be converted by the luminescent material into luminescent material light, and part of the unit light may be transmitted by the luminescent element. In such embodiments, in an operational mode the system light may comprise both unit light and luminescent material light. This may especially be relevant when e.g. the unit light comprises visible light, such as blue light. Hence, in specific embodiments the unit light may comprise one or more wavelengths in the visible, especially in embodiments one or more wavelengths in the blue wavelength range. In specific embodiments, wherein the system light may be white light, at least part of the visible light, such as at least part of the blue light, may be provided by the unit light. Hence, in such embodiment, luminescent material light and unit light may escape from this first luminescent element face.

In other embodiments, however, at least part of the spectral power of the unit light may be converted by the luminescent material into luminescent material light, and substantially no unit light is transmitted by the luminescent element. Hence, in such embodiment, luminescent material light (but essentially no unit light) may escape from this first luminescent element face. Of course, in such embodiments the system light may in specific embodiments also be white light (see also below).

The terms "violet light" or "violet emission" especially relates to light having a wavelength in the range of about 380-440 nm. The terms "blue light" or "blue emission" especially relate to light having a wavelength in the range of about 440-490 nm (including some violet and cyan hues). The terms "green light" or "green emission" especially relate to light having a wavelength in the range of about 490-560 nm. The terms "yellow light" or "yellow emission" especially relate to light having a wavelength in the range of about 560-590 nm. The terms "orange light" or "orange emission" especially relate to light having a wavelength in the range of about 590-620. The terms "red light" or "red emission" especially relate to light having a wavelength in the range of about 620-750 nm. The term "cyan" may refer to one or more wavelengths selected from the range of about 490-520 nm. The term "amber" may refer to one or more wavelengths selected from the range of about 585-605 nm, such as about 590-600 nm.

Especially, the optical element comprises an external surface. The term "external surface" may refer to the entire external surface of the optical element. Would the optical element, only by way of example have a cubic shape, the surfaces of the six sides form the external surface, and the cumulated area of the six sides define the area of the external surface.

Especially, the optical element is configured between the luminescent element and the reflective element.

Especially, the external surface of the optical element may comprise three parts. A first part of the external surface may be directed to the second luminescent face, a second part of the external surface may be directed to the reflective element, and a third part. Especially, the third part is neither directed to the luminescent element and the reflective element, and may thereby be accessible by the unit light. Hence, the third part of the externa surface may be configured in a light receiving relationship with the lighting unit. Especially, this may imply that during operation at least part of the third part may receive unit light. Hence, the third part of the optical element, or at least part of the third part, may be configured downstream of the lighting unit.

The terms "upstream" and "downstream" relate to an arrangement of items or features relative to the propagation of the light from a light generating means (here the especially the light source), wherein relative to a first position within a beam of light from the light generating means, a second position in the beam of light closer to the light generating means is "upstream", and a third position within the beam of light further away from the light generating means is "downstream".

The terms "radiationally coupled" or "optically coupled" may especially mean that (i) a light generating element, such as a light source, and (ii) another item or material, are associated with each other so that at least part of the radiation emitted by the light generating element is received by the item or material. In other words, the item or material is configured in a light-receiving relationship with the light generating element. At least part of the radiation of the light generating element will be received by the item or material. This may in embodiments be directly, such as the item or material in physical contact with the (light emitting surface of the) light generating element. This may in embodiments be via a medium, like air, a gas, or a liquid or solid light guiding material. In embodiments, also one or more optics, like a lens, a reflector, an optical filter, may be configured in the optical path between light generating element and item or material. The term "in a light-receiving relationship" does, as indicated above, not exclude the presence of intermediate optical elements, such as lenses, collimators, reflectors, dichroic mirrors, etc. In embodiments, the term "light-receiving relationship" and "downstream" may essentially be synonyms.

As indicated above, the unit light may enter the optical element, be reflected at the reflective element, and leave the optical element again at the position of the luminescent element. The optical element may especially be used to distribute the unit light over the luminescent element. The optical element also (further) provides some freedom where the lighting unit(s) are positions.

It appears useful when the bottom of the optical element may be larger than the top of the optical element. Hence, especially in embodiments a first area A1 of the first part may be smaller than a second area A2 of the second part. In embodiments, $1 \leq A2/A1 \leq 25$, such as in embodiments $1 < A2/A1 \leq 25$. Even more especially, $1.5 \leq A2/A1 \leq 25$, such as $2 \leq A2/A1 \leq 16$.

Especially, the optical element is transmissive for the unit light. Hence, the optical element may comprise a light transmissive, especially light transparent, material.

The light transmissive material may comprise one or more materials selected from the group consisting of a transmissive organic material, such as selected from the group consisting of PE (polyethylene), PP (polypropylene), PEN (polyethylene napthalate), PC (polycarbonate), polyurethanes (PU), polymethylacrylate (PMA), polymethylmethacrylate (PMMA) (Plexiglas or Perspex), polymethacrylimide (PMI), polymethylmethacrylimide (PMMI), styrene acrylonitrile resin (SAN), cellulose acetate butyrate (CAB), silicone, polyvinylchloride (PVC), polyethylene terephthalate (PET), including in an embodiment (PETG) (glycol modified polyethylene terephthalate), PDMS (polydimethylsiloxane), and COC (cyclo olefin copolymer). Especially, the light transmissive material may comprise an aromatic polyester, or a copolymer thereof, such as e.g. one or more of polycarbonate (PC), poly (methyl)methacrylate (P(M)MA), polyglycolide or polyglycolic acid (PGA), polylactic acid (PLA), polycaprolactone (PCL), polyethylene adipate (PEA), polyhydroxy alkanoate (PHA), polyhydroxy butyrate (PHB), poly(3-hydroxybutyrate-co-3-hydroxyvalerate) (PHBV), polyethylene terephthalate (PET), polybutylene terephthalate (PBT), polytrimethylene terephthalate (PTT), polyethylene naphthalate (PEN). Especially, the light transmissive material may comprise polyethylene terephthalate (PET). Hence, the light transmissive material is especially a polymeric light transmissive material.

However, in another embodiment the light transmissive material may comprise an inorganic material. Especially, the inorganic light transmissive material may be selected from the group consisting of glasses, (fused) quartz, transmissive ceramic materials, and silicones. Also hybrid materials, comprising both inorganic and organic parts may be applied. Especially, the light transmissive material comprises one or more of PMMA, transparent PC, or glass.

For instance, the light transmissive element may comprise a ceramic body, like a garnet type of material. In alterative embodiments, the light transmissive element may comprise an alumina material, such as an $Al_2O_3$ based material. In embodiments, the light transmissive element may comprise e.g. sapphire. Other materials may also be possible like one or more of $CaF_2$, $MgO$, $BaF_2$, $A_3B_5O_{12}$ garnet, ALON (aluminum oxynitride), $MgAl_2O_4$ and $MgF_2$.

Especially, the material has a light transmission in the range of 50-100%, especially in the range of 70-100%, for light having a wavelength selected from the visible wavelength range. Herein, the term "visible light" especially relates to light having a wavelength selected from the range of 380-780 nm.

The transmission (or light permeability) can be determined by providing light at a specific wavelength with a first intensity to the light transmissive material under perpendicular radiation and relating the intensity of the light at that wavelength measured after transmission through the material, to the first intensity of the light provided at that specific wavelength to the material (see also E-208 and E-406 of the CRC Handbook of Chemistry and Physics, 69th edition, 1088-1989).

In specific embodiments, a material may be considered transmissive when the transmission of the radiation at a wavelength or in a wavelength range, especially at a wavelength or in a wavelength range of radiation generated by a source of radiation as herein described, through a 1 mm thick layer of the material, especially even through a 5 mm thick layer of the material, under perpendicular irradiation with said radiation is at least about 20%, such as at least 40%, like at least 60%, such as especially at least 80%, such as at least about 85%, such as even at least about 90%.

The light transmissive material has light guiding or wave guiding properties. Hence, the light transmissive material is herein also indicated as waveguide material or light guide material. The light transmissive material will in general have (some) transmission of one or more of (N)UV, visible and (N)IR radiation, such as in embodiments at least visible light, in a direction perpendicular to the length of the light transmissive material. Without the activator (dopant) such as trivalent cerium, the internal transmission in the visible might be close to 100%.

The transmission of the light transmissive material (as such) for one or more luminescence wavelengths may be at least 80%/cm, such as at least 90%/cm, even more especially at least 95%/cm, such as at least 98%/cm, such as at least 99%/cm. This implies that e.g. a 1 $cm^3$ cubic shaped piece of light transmissive material, under perpendicular irradiation of radiation having a selected luminescence wavelength (such as a wavelength corresponding to an emission maximum of the luminescence of the luminescent material of the light transmissive material), will have a transmission of at least 95%.

Herein, values for transmission especially refer to transmission without taking into account Fresnel losses at interfaces (with e.g. air). Hence, the term "transmission" especially refers to the internal transmission. The internal transmission may e.g. be determined by measuring the transmission of two or more bodies having a different width over which the transmission is measured. Then, based on such measurements the contribution of Fresnel reflection losses and (consequently) the internal transmission can be determined. Hence, especially, the values for transmission indicated herein, disregard Fresnel losses.

In embodiments, an anti-reflection coating may be applied to the luminescent body, such as to suppress Fresnel reflection losses (during the light incoupling process).

In addition to a high transmission for the wavelength(s) of interest, also the scattering for the wavelength(s) may especially be low. Hence, the mean free path for the wavelength of interest only taking into account scattering effects (thus not taking into account possible absorption (which should be low anyhow in view of the high transmission), may be at least 0.5 times the length of the body, such as at least the length of the body, like at least twice the length of the body. For instance, in embodiments the mean free path only taking into account scattering effects may be at least 5 mm, such as at least 10 mm. The wavelength of interest may especially be the wavelength at maximum emission of the luminescence of the luminescent material. The term "mean free path" is especially the average distance a ray will travel before experiencing a scattering event that will change its propagation direction.

In embodiments, the element comprising the light transmissive material may essentially consist of the light transmissive material. In specific embodiments, the element comprising the light transmissive material may be a light transparent element.

Especially, the light transmissive element, such as the light transparent element, may in embodiments have an absorption length and/or a scatter length of at least the length (or thickness) of the light transmissive element, such as at least twice the length of the light transmissive element. The absorption length may be defined as the length over which the intensity of the light along a propagation direction due to absorption drops with 1/e. Likewise, the scatter length may be defined as the length along a propagation direction along which light is lost due to scattering and drops thereby with a factor 1/e. Here, the length may thus especially refer to the distance between a first face and a second face of the light transmissive element, with the light transmissive material configured between the first face and second face.

Especially, the optical element may be selected from the group consisting of a ceramic body, a single crystal (such as alumina, like e.g. sapphire), glass, and quartz.

Especially, the reflective element may be configured to reflect unit light. The reflective element may be provided by a reflective layer, like an Al layer. Alternatively, the reflective element may be provided by a body having reflective properties, such as by a light reflective heatsink (see also below).

In this way, during operation of the system, unit light may enter the optical element via the third part, propagate through the optical element, be reflected at the reflector when escaping from the optical element at the second part, propagate further through the optical element, escape from the optical element at the first part, irradiate the luminescent material comprised by the luminescent element and be at least partially converted by the luminescent material. In specific embodiments, part of the unit light may propagate through the luminescent element, and also escape from the first luminescent element face of the luminescent element (together with luminescent material light). Hence, in embodiments the lighting unit may especially be configured such that in an operational mode the lighting unit is configured to irradiate the first element face via transmission through the optical element and reflection at the reflective element.

As indicated above, during operation the luminescent element may be irradiated at the second luminescent element face whereby luminescent material light may be generated. Especially, the luminescent element may be configured such that at least part of this light escapes from the first luminescent element face. It is not excluded that part of the unit light may be transmitted by the luminescent element.

Hence, the system may especially be configured to generate in an operational mode system light, wherein (in that operational mode) the system light at least comprises luminescent material light, and optionally unit light.

The system, or apparatus, or device may execute an action in a "mode" or "operation mode" or "mode of operation" or "operational mode". Likewise, in a method an action or stage, or step may be executed in a "mode" or "operation mode" or "mode of operation" or "operational mode". The term "mode" may also be indicated as "controlling mode". This does not exclude that the system, or apparatus, or device may also be adapted for providing another controlling mode, or a plurality of other controlling modes. Likewise, this may not exclude that before executing the mode and/or after executing the mode one or more other modes may be executed.

However, in embodiments a control system may be available, that is adapted to provide at least the controlling mode. Would other modes be available, the choice of such modes may especially be executed via a user interface, though other options, like executing a mode in dependence of a sensor signal or a (time) scheme, may also be possible. The operation mode may in embodiments also refer to a system, or apparatus, or device, that can only operate in a single operation mode (i.e. "on", without further tunability).

The system may also comprise one or more further light sources configured to generate (further) light source light, which ((further) light source) light may be transmitted at the luminescent element, and/or which ((further) light source) light may be reflected a the luminescent element, and/or which ((further) light source) light may bypass the luminescent element. This ((further) light source) light may in an operational mode be admixed to the system light, lead to an operation mode wherein the system light comprises the luminescent material light, other light source light, and optionally unit light. In embodiments, a spectral power distribution of the system light may be controllable; see also below.

As indicated above, the invention may be used to distribute the unit light over the second element face. This may lead to a lower local heating up and a better thermal management, especially of the luminescent element.

In embodiments, the lighting unit may be configured such that in the operational mode the lighting unit is configured to irradiate at least 20% of (the area of) the second element face via transmission through the optical element and reflection at the reflective element.

The percentage of the irradiation of the second element face may be controlled by the choice of the light source of the lighting units, the optional optics which may be comprised by the lighting unit, the angle under which the lighting unit irradiates the third part, as well as angles of the third part relative to the first part and the second part.

Especially, the area of the first part of the optical element, i.e. A1, may essentially be the same as an area of the second luminescent element face. Indicating the area of the second luminescent element face as A5, $0.98 \leq A1/A5 \leq 1.1$ may apply, such as $0.99 \leq A1/A5 \leq 1.01$.

Especially, in embodiments the lighting unit may be configured such that in the operational mode the lighting unit is configured to irradiate at least 40% of (the area of) the second element face (via transmission through the optical element and reflection at the reflective element), even more especially at least 50%, such as at least 70%, like in specific embodiments at least 80%. The percentage used herein may refer to the unit light defined by at least $1/e^2$ of a maximum of a spectral power of the unit light (see also below).

Hence, in specific embodiments, the lighting unit is configured such that in the operational mode the lighting unit is configured to irradiate (via transmission through the optical element and via reflection at the reflective element (downstream of the second part)) at least 70% of the second element face.

Further, in embodiments the lighting unit may especially be configured to irradiate at least 10% of the second part via transmission through the optical element, such as at least 15%, like at least 20%, or even at least about 30%.

Therefore, in specific embodiments the lighting unit may be configured such that in the operational mode the lighting unit is configured to irradiate at least 20% of the second part via transmission through the optical element, and via reflection at the reflective element (downstream of the second part) at least 70% of the second element face.

In embodiments, the reflective element may be specular reflective. Especially, in such embodiments the lighting unit may especially be configured to irradiate at least 10% of the second part (via transmission through the optical element). However, in other embodiments the reflective element may be diffuse reflective. With using a specular reflective element, the efficiency may be higher. However, when using a diffuse reflective element in combination with a second reflective element (see below), the efficiency may also be relatively high. Especially, however, in embodiments the reflective element is specular reflective.

Basically, the optical element may have any shape. Especially, however the optical element is a closed (massive) body. Further, especially the optical element may be defined by the first part, the second part and the third part, with the first part having a first area A1 which may in specific embodiments be smaller than the second area A2 of the second part. A third area of the third part may be smaller than the first area or larger than the first area. The third area may be smaller than the second area or larger than the second area. In general, the area of the third part may be larger than the area of the first part, though this is not necessarily the case.

In embodiments the optical element comprises a first face comprising the first part. Especially, in embodiments the first face is the first part. Further, in embodiments the optical element comprises a second face comprising the second part. Especially, in embodiments the second face is the first part. Yet further, in embodiments the optical element comprises one or more third faces comprising the third part. Especially, in embodiments the one or more third faces define the third part.

In embodiments, the first part may be curved or may be planar. In specific embodiments, the first part may be flat. Hence, especially, in embodiments the first face may be planar.

In embodiments, the second part may be curved or may be planar. In specific embodiments, the second part may be flat. Hence, especially, in embodiments the second face may be planar.

In embodiments, there third part may be curved. In other embodiments, the third part may be facetted. Hence, in embodiments, as indicated above, the third part may be defined by a plurality of faces, like at least two faces, even more especially at least three faces. When the third part is defined by two faces, these faces may be curved. When the third part is defined by at least three faces, one or more of the three faces may be curved and one or more of the three faces may be planar. Especially, in embodiments the at least three faces may be planar. Hence, the term "third face" may also refer to a plurality of third faces.

Especially, in embodiments the first face and the second face may be configured parallel. Hence, in embodiments the third face(s) may bridge the first face and the second face.

In embodiments, the third face and the first face may have a first mutual angle $\alpha_{1,3}$. Especially, in embodiments $100°\leq\alpha_{1,3}\leq175°$, such as $110°\leq\alpha_{1,3}\leq170°$, like equal to or smaller than about 150°, like in embodiments in the range of 120-150°. In embodiments the third face and the second face may have a second mutual angle $\alpha_{2,3}$. Alternatively or additionally, in embodiments $5°\leq\alpha_{2,3}<80°$, such as $10°\leq\alpha_{2,3}\leq75°$, like especially equal to or larger than about 15°, such as in embodiments $15°\leq\alpha_{2,3}\leq75°$, such as in embodiments selected from the range of 30-60° (see also below). As indicated above, the optical element may comprise a plurality of third faces. For each of these faces, these conditions in relation to the first mutual angle and the second mutual angle may (individually) apply.

In embodiments, the first face may be in optical contact with the luminescent element, especially in embodiments in physical contact. The second face may especially be in thermal contact with the reflective element, especially in embodiments in physical contact.

When elements are in optical contact or optically coupled, they may in embodiments be in physical contact with each other or may in other embodiments be separated from each other with e.g. a (thin) layer of optical material, such as an optical glue, or other optically transparent interface material, e.g. having a thickness of less than about 1 mm, preferably less than 100 μm. When no optically transparent interface material is applied, the (average) distance between two elements being in optical contact may especially be about at maximum the wavelength of relevance, such as the wavelength of an emission maximum. For visible wavelengths, this may be less than 1 μm, such as less than 0.7 μm, and for blue even smaller. Hence, when optical coupling is desired, an optically transparent interface material may be applied. In yet other embodiments, when no optically transparent interface material is applied, the average distance between two elements being in optical contact may especially be about at maximum the wavelength of relevance, such as the wavelength of an emission maximum. Hence, when optical contact is desired, there may be physical contact. However, even in such embodiments there may be a non-zero average distance, but then equal to or lower than the wavelength of interest, such as a centroid wavelength of the luminescent material light.

The term "centroid wavelength", also indicated as λc, is known in the art, and refers to the wavelength value where half of the light energy is at shorter and half the energy is at longer wavelengths; the value is stated in nanometers (nm). It is the wavelength that divides the integral of a spectral power distribution into two equal parts as expressed by the formula $\lambda c=\Sigma\lambda*I(\lambda)/\Sigma I(\lambda)$, where the summation is over the wavelength range of interest, and $I(\lambda)$ is the spectral energy density (i.e. the integration of the product of the wavelength and the intensity over the emission band normalized to the integrated intensity). The centroid wavelength may e.g. be determined at operation conditions.

An element may be considered in thermal contact with another element if it can exchange energy through the process of heat. Hence, the elements may be thermally coupled. In embodiments, thermal contact can be achieved by physical contact. In embodiments, thermal contact may be achieved via a thermally conductive material, such as a thermally conductive glue (or thermally conductive adhesive). Thermal contact may also be achieved between two elements when the two elements are arranged relative to each other at a distance of equal to or less than about 10 μm, though larger distances, such as up to 100 μm may be possible. The shorter the distance, the better the thermal contact. Especially, the distance is 10 μm or less, such as 5 μm or less. The distance may be the distanced between two respective surfaces of the respective elements. The distance may be an average distance. For instance, the two elements may be in physical contact at one or more, such as a plurality of positions, but at one or more, especially a plurality of other positions, the elements are not in physical contact. For instance, this may be the case when one or both elements have a rough surface. Hence, in embodiments in average the distance between the two elements may be 10 μm or less (though larger average distances may be possible, such as up to 100 μm). In embodiments, the two surfaces of the two elements may be kept at a distance with one or more distance holders.

Therefore, in specific embodiments the optical element may comprise a first face comprising the first part, a second face comprising the second part, and one or more third faces comprising the third part, wherein in specific embodiments the first face and the second face may be configured parallel, wherein the first face may be in physical contact with the luminescent element, wherein the second face may be in physical contact with the reflective element, wherein the third face and the first face may have a first mutual angle $\alpha_{1,3}$, and wherein the third face and the second face may have a second mutual angle $\alpha_{2,3}$, wherein $100° \leq \alpha_{1,3} \leq 175°$, and wherein $5° \leq \alpha_{2,3} \leq 80°$.

In specific embodiments, the optical element has the shape of a frustum, with one or more edges defined by the one or more third faces. Especially, a frustum may be defined as the portion of a solid (normally a cone or pyramid) that lies between one or two parallel planes cutting it. In embodiments, the frustum may be a conical frustum. In such embodiments, the third face is especially a curved face. In other embodiments, the frustum may be a pyramidal frustum. In such embodiments the third face may be facetted (i.e. a plurality of third faces). Especially, in embodiments the optical element has the shape of a right frustum. A right frustum may be defined as a parallel truncation of a right pyramid or right cone. Alternatively, the optical element may have the shape of a parallel truncation of a tetrahedron.

As indicated above, in specific embodiments the optical element may have the shape of a parallel truncation of a (right) pyramid, having three or more third faces, like a truncated tetrahedron, a truncated right pyramid, etc. In embodiments, the right frustum may have 3-12 third faces, such as 4-8 third faces. In specific embodiments, each third face may be configured in a light receiving relationship with a specific lighting unit (see also below).

The mutual angles of the parts, such as the mutual angles of the faces, as well as the angle under which the beam of unit light irradiates the third face may be chosen such that a desirable distribution of the unit light over the second luminescent element face may be obtained. Further, these angles may be chosen such that a good light incoupling in the optical element and/or a good reflection at the reflective element, and/or a good light incoupling in the luminescent element may be obtained.

To define the angle of the beam relative to the optical element, herein a virtual plane is used, which may be configured perpendicular to the second part, such as the second face. Further, in specific embodiments this virtual plane may also be configured perpendicular to the first part, such as the first face. Further, this virtual plane used to define the angle of the beam relative to at least part of the third part, such as the third face, may also be configured perpendicular to the third part, such as one of the one or more third faces.

Further, to define the angle of the beam relative to the optical element, a normal to the second part may be used, which may thus in embodiments be a normal to the second face. Further, in specific embodiments this normal may also be a normal to the first part, such as in embodiments the first face. However, this normal is in embodiments especially not a normal to the third part, such as one or more of the third faces. As can be derived from the above, in embodiments the third part may especially be configured slanted (relative to the first part and the second part). Yet further, the beam may be defined by all spectral power intensities between a maximum and a value of $1/e^2$ of that maximum. This may provide a smallest incidence angle and a largest incidence angle (on the slanted part), though in the case of a perfectly collimated beam of unit light, these smallest incidence angle and a largest incidence angle may be identical. It appears useful the smallest incidence angle is smaller than an angle of the third part with the normal. This latter angle is indicated as third angle $\alpha 3$. Note that the above mentioned $\alpha_{2,3}$ plus the third angle may be together 90°. Hence, in embodiments in a first plane (P1) perpendicular to the second part, relative to a first normal (N1) to the second part and configured in the first plane (P1), the beam has a smallest incidence angle ($\alpha 1$) on the third part and a largest incidence angle ($\alpha 2$) on the third part, wherein the third part has a third angle ($\alpha 3$) with the normal (N1), wherein $\alpha 3 > \alpha 1$, and wherein the beam of unit light is defined by at least $1/e^2$ of a maximum of a spectral power of the unit light. In specific embodiments, the third angle ($\alpha 3$) is selected from the range of 10-85°, such as in embodiments 10-85°, like in specific embodiments 15-75° (see also above).

The beam provided by the lighting unit may be a divergent beam, or a focused beam, or a collimated beam. Hence, the beam of unit light may be selected from the group consisting of a divergent beam, a focused beam, and a collimated beam Here, in this context it is referred to a beam that is essentially collimated, i.e. substantially not divergent and substantially not focused. In specific embodiments, the beam of unit light is selected from the group consisting of a focused beam, and a collimated beam. With a focused beam or a collimated beam, especially the (re)distribution of the unit light over the second luminescent element face may be obtained. However, this may also be possible with a divergent beam. When using a second reflective element (see below), the beam may be focused beam or a collimated beam, especially in embodiments a focused beam.

As indicated above, the lighting unit may comprise a light source. In specific embodiments, the light source may be selected from the group consisting of a laser diode and a superluminescent diode. Therefore, in embodiments the lighting unit may comprise a light source configured to generate light source light, wherein the unit light comprises at least part of the light source light. Especially, the light source may be selected from the group consisting of a laser diode and a superluminescent diode. Especially, in embodiments the unit light may essentially consist of the light source light, such as laser light.

As indicated above, it may be desirable to further focus, diverge, or collimate the light source light. Further, it may be desirable to direct the beam of light. Therefore, the lighting unit may comprise an optical element, indicated as second optical element. Hence, in embodiments the lighting unit may further comprises one or more second optical elements configured to one or more of (i) shape the beam of unit light, and direct the beam of unit light. Instead of the term "second optical element", and similar terms, also the term "optics" may be applied. The optics may include one or more or mirrors, reflectors, collimators, lenses, prisms, diffusers, phase plates, polarizers, diffractive elements, gratings, dichroics, arrays of one or more of the afore-mentioned, etc.

In specific embodiments, the focusing optics comprise reflective focusing optics. Especially such optics allow a good focusing and a compact light generating devices. In specific embodiments, the reflective focusing optics are (thus) configured to reflect and focus the laser light source light into a focused beam of laser light source light. In yet further specific embodiments, the focusing optics may be selected from the group of parabolic mirrors and ellipsoid mirrors. Alternatively or additionally, in further specific embodiments, the focusing optics may be selected from the group free-shaped mirrors, e.g. to customize the exact shape of the focus on the luminescent body.

In specific embodiments, the focusing optics may be selected from ellipsoid mirrors. An Ellipse curve is a Cartesian oval, a set of points that have the same linear combination of distances from two fixed points. An ellipsoid is an ellipse curve rotated in space around its long axis. An ellipsoid mirror may especially have two focal points. Light exiting from the first focal point is focused onto the second focal point. In the present case, a laser is positioned in the first focal point, and the laser light is focused onto the phosphor in the second focal point. The distance between the focal points (focal distance) can be chosen by the dimensions of the ellipsoid. In the case of the laser with a limited radiation angle, only a small part of the ellipsoid may be needed to reflect all the light and focus it onto the phosphor.

As indicated above, in embodiments each laser light source may comprise its respective focusing optics, especially its respective reflective focusing optics. This may allow providing the laser light source and respective optics as single unit. Such single unit may be easily replaced and facilitates adjustment, as the light source and optics are not separate units. Hence, in embodiments the light generating device comprises n lighting units, wherein each of the n lighting units comprises (i) the laser light source configured to generate the laser light source light and (ii) focusing optics configured to (reflect and) focus the laser light source light into a focused beam of laser light source light.

When the number of focusing optics is at least 4, like especially at least 8, the focusing optics may be configured in a ring shape. The series of at least 4 focusing optics may be configured around the luminescent body but will in general be configured at some distance from the luminescent body (i.e. over the luminescent body, optionally with some lateral displacement relative to the luminescent body).

As indicated above, in embodiments the light generating device comprises two or more laser light sources. Hence, in embodiments n≥2. Especially, however, in embodiments n≥4. In embodiments, n may be selected from the range of 2-50. However, more than 50 laser light sources is herein not excluded. Especially, however, n may be selected from the range of 2-25, such as 4-25.

When n≥4, especially when n≥8, the (laser) light sources may be configured in a ring shape around the luminescent body.

Especially, in embodiments the laser light sources are configured to generate laser light source light having the same color point. In specific embodiments, colors or color points of a first type of light and a second type of light may be essentially the same when the respective color points of the first type of light and the second type of light differ with at maximum 0.03 for u' and/or with least 0.03 for v', even more especially at maximum 0.02 for u' and/or with least 0.02 for v'. In yet more specific embodiments, the respective color points of first type of light and the second type of light may differ with at maximum 0.01 for u' and/or with least 0.01 for v'. Here, u' and v' are color coordinate of the light in the CIE 1976 UCS (uniform chromaticity scale) diagram. In specific embodiments, the laser light sources may be of the same bin.

Hence, in specific embodiments the light generating system may comprise a plurality of lighting units configured to irradiate different parts of the third part of the externa surface. Two or more lighting units may also be configured to irradiate the same part of the third part. For instance, in embodiments the light generating system may comprise a plurality of sets of lighting units configured to irradiate different parts of the third part of the externa surface, wherein each set comprise at least a single lighting unit. Sets comprising more than one lighting unit may be configured to irradiate the same part of the third part. For instance, sets comprising more than one lighting unit may be configured to irradiate respective faces comprised by the third part.

In specific embodiments, the optical element may be enclosed by the luminescent element, the reflective element, and a second reflective element, wherein the latter is configured such, that there is an inlet for the unit light. For instance, this inlet may be a hole in the second reflector. The second reflector may especially be reflective for the unit light. In this way, unit light within the optical element may essentially only escape via the third part. Further, in embodiments the second reflective element may also be reflective for the luminescent material light. In this way, luminescent material light that may escape from the second luminescent element face, may be redirected into the luminescent element and may have a second chance to escape from the luminescent element via the first luminescent element face. Hence, in specific embodiments the light generating system may comprise a second reflective element, wherein the second reflective element is configured to reflect unit light that escapes from the optical element via the one or more third faces back into the optical element, wherein the third part has a third area A3, wherein the one or more third faces have a fourth area A4, wherein at least 25% of the fourth area A4 is directed to the second reflective element and wherein at maximum 75% of the fourth area A4 is defined by the third area A3. Even more especially, at least 50% of the fourth area A4 is directed to the second reflective element and at maximum 25% of the fourth area A4 is defined by the third area A3. In specific embodiments, at maximum 95% of the fourth area A4 is directed to the second reflective element, such as at maximum 90%. Note that when different lighting units provide light to different faces, each of the faces may be directed to a respective second reflective element including e.g. an opening for entry of the unit light. The accumulate areas of these openings may be essentially A4-A3. Note that when there is no second reflective element, A4 and A3 may essentially be the same. In embodiments, the second reflective element may be a reflective coating.

It may be desirable when the luminescent material and/or the optical element may be able to dissipate thermal energy to a thermally conductive element. A thermally conductive element may comprise thermally conductive material. A thermally conductive material may especially have a thermal conductivity of at least about 20 W/(m*K), like at least about 30 W/(m*K), such as at least about 100 W/(m*K), like especially at least about 200 W/(m*K). In yet further specific embodiments, a thermally conductive material may especially have a thermal conductivity of at least about 10 W/(m*K). In embodiments, the thermally conductive material may comprise of one or more of copper, aluminum, silver, gold, silicon carbide, aluminum nitride, boron nitride, aluminum silicon carbide, beryllium oxide, a silicon carbide composite, aluminum silicon carbide, a copper tungsten alloy, a copper molybdenum carbide, carbon, diamond, and graphite. Alternatively, or additionally, the thermally conductive material may comprise or consist of aluminum oxide.

The thermally conductive element may comprise a heat spreader or a heat sink. Heatsinks are known in the art. The term "heatsink" (or heat sink) may especially be a passive heat exchanger that transfers the heat generated by device, such as an electronic device or a mechanical device, to a fluid (cooling) medium, often air or a liquid coolant. Thereby, the heat is (at least partially) dissipated away from the device. A heat sink is especially designed to maximize its surface area in contact with the fluid cooling medium surrounding it. Hence, especially a heatsink may comprise a plurality of fins. For instance, the heatsink may be a body with a plurality of fins extending thereof. A heatsink especially comprises (more especially consists of) a thermally conductive material. The term "heatsink" may also refer to a plurality of (different) heatsinks.

A heat spreader may be configured to transfer energy as heat from a first element to a second element. The second element may especially be a heatsink or heat exchanger. A heat spreader may passive or active. Embodiments of passive heat spreaders may comprise a plate or block of material having high thermal conductivity, such as copper, aluminum, or diamond. An active heat spreader may be configured to speed up heat transfer with expenditure of energy as work supplied by an external source. Herein, the heat spreader may especially be a passive heat spreader. Alternatively or additionally, the heat spreader may be an active heat spreader, such as selected from the group of heat pipes and vapor chambers.

The reflective element and the thermally conductive element may be the same element, when the thermally conductive element is reflective, such as may be the case with an Al heatsink. Alternatively, or additionally, the thermally conductive element may be provided with a reflector, especially a reflective layer. Hence, in embodiments the light generating system may comprise a thermally conductive element, wherein the reflective element is defined by the thermally conductive element or is configured as reflective layer on the thermally conductive element; and wherein the thermally conductive element comprises a heatsink.

In specific embodiments, the luminescent material comprise a luminescent material of the type $A_3B_5O_{12}$:Ce, wherein A comprises one or more of Y, La, Gd, Tb and Lu, and wherein B comprises one or more of Al, Ga, In and Sc (see also above).

Further, in specific embodiments the optical element may be selected from the group consisting of a ceramic body, a single crystal (such as alumina, like e.g. sapphire), glass, and quartz.

The system may be configured to provide in an operational mode white light. The term "white light" herein, is known to the person skilled in the art. It especially relates to light having a correlated color temperature (CCT) between about 1800 K and 20000 K, such as between 2000 and 20000 K, especially 2700-20000 K, for general lighting especially in the range of about 2700 K and 6500 K. In embodiments, for backlighting purposes the correlated color temperature (CCT) may especially be in the range of about 7000 K and 20000 K. Yet further, in embodiments the correlated color temperature (CCT) is especially within about 15 SDCM (standard deviation of color matching) from the BBL (black body locus), especially within about 10 SDCM from the BBL, even more especially within about 5 SDCM from the BBL.

The terms "visible", "visible light" or "visible emission" and similar terms refer to light having one or more wavelengths in the range of about 380-780 nm. Herein, UV may especially refer to a wavelength selected from the range of 200-380 nm.

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to (at least) visible light.

In embodiments, the system may further comprise a control system or may be functionally coupled to a control system. For instance, when the system comprises a plurality of light sources and/or further light sources, the control system may be configured to control the light sources and/or further light sources. In embodiments, the control system may be configured to control spectral properties of the system light, like e.g. one or more of color point and correlated color temperature.

The term "controlling" and similar terms especially refer at least to determining the behavior or supervising the running of an element. Hence, herein "controlling" and similar terms may e.g. refer to imposing behavior to the element (determining the behavior or supervising the running of an element), etc., such as e.g. measuring, displaying, actuating, opening, shifting, changing temperature, etc. Beyond that, the term "controlling" and similar terms may additionally include monitoring. Hence, the term "controlling" and similar terms may include imposing behavior on an element and also imposing behavior on an element and monitoring the element. The controlling of the element can be done with a control system, which may also be indicated as "controller". The control system and the element may thus at least temporarily, or permanently, functionally be coupled. The element may comprise the control system. In embodiments, the control system and element may not be physically coupled. Control can be done via wired and/or wireless control. The term "control system" may also refer to a plurality of different control systems, which especially are functionally coupled, and of which e.g. one control system may be a master control system and one or more others may be slave control systems. A control system may comprise or may be functionally coupled to a user interface.

The control system may also be configured to receive and execute instructions form a remote control. In embodiments, the control system may be controlled via an App on a device, such as a portable device, like a Smartphone or iPhone, a tablet, etc. The device is thus not necessarily coupled to the lighting system, but may be (temporarily) functionally coupled to the lighting system.

Hence, in embodiments the control system may (also) be configured to be controlled by an App on a remote device. In such embodiments the control system of the lighting system may be a slave control system or control in a slave mode. For instance, the lighting system may be identifiable with a code, especially a unique code for the respective lighting system. The control system of the lighting system may be configured to be controlled by an external control system which has access to the lighting system on the basis of knowledge (input by a user interface of with an optical sensor (e.g. QR code reader) of the (unique) code. The lighting system may also comprise means for communicating with other systems or devices, such as on the basis of Bluetooth, WIFI, LiFi, ZigBee, BLE or WiMAX, or another wireless technology.

Hence, in embodiments, the control system may control in dependence of one or more of an input signal of a user interface, a sensor signal (of a sensor), and a timer. The term "timer" may refer to a clock and/or a predetermined time scheme.

The light generating system may be part of or may be applied in e.g. office lighting systems, household application systems, shop lighting systems, home lighting systems, accent lighting systems, spot lighting systems, theater lighting systems, fiber-optics application systems, projection systems, self-lit display systems, pixelated display systems, segmented display systems, warning sign systems, medical lighting application systems, indicator sign systems, decorative lighting systems, portable systems, automotive applications, (outdoor) road lighting systems, urban lighting systems, green house lighting systems, horticulture lighting, digital projection, or LCD backlighting. The light generating system (or luminaire) may be part of or may be applied in e.g. optical communication systems or disinfection systems.

In yet a further aspect, the invention provides an integrated light source package comprising the light generating system according to any one of the preceding claims.

The integrated light source package may comprise a common support member configured to support the lighting unit, or at least its light source, and the optical element. The common support member may be configured to transport thermal energy from the light source and the luminescent element, and the optical element, to a heatsink, or the common support member may be a heatsink. In embodiments, the common support member may be a heatsink or a heat spreader.

In embodiments of the system, the system comprises an SMD package comprising the lighting unit, the luminescent element, and the optical element, and optionally also the reflective element. Especially, in embodiments the system comprises an SMD package comprising the lighting unit, the luminescent element, the optical element, and the reflective element.

In yet a further aspect, the invention also provides a lamp or a luminaire comprising the light generating system as defined herein. The luminaire may further comprise a housing, optical elements, louvres, etc. etc. . . . The lamp or luminaire may further comprise a housing enclosing the light generating system. The lamp or luminaire may comprise a light window in the housing or a housing opening, through which the system light may escape from the housing. In yet a further aspect, the invention also provides a projection device comprising the light generating system as defined herein. Especially, a projection device or "projector" or "image projector" may be an optical device that projects an image (or moving images) onto a surface, such as e.g. a projection screen. The projection device may include one or more light generating systems such as described herein. Hence, in an aspect the invention also provides a light generating device selected from the group of a lamp, a luminaire, a projector device, a disinfection device, and an optical wireless communication device, comprising the light generating system as defined herein.

Instead of the terms "lighting device" or "lighting system", and similar terms, also the terms "light generating device" or "light generating system", (and similar terms), may be applied. A lighting device or a lighting system may be configured to generate device light (or "lighting device light") or system light ("or lighting system light"). As indicated above, the terms light and radiation may interchangeably be used.

The lighting device may comprise a light source. The device light may in embodiments comprise one or more of light source light and converted light source light (such as luminescent material light).

The lighting system may comprise a light source. The system light may in embodiments comprise one or more of light source light and converted light source light (such as luminescent material light).

The terms "light" and "radiation" are herein interchangeably used, unless clear from the context that the term "light" only refers to visible light. The terms "light" and "radiation" may thus refer to UV radiation, visible light, and IR radiation. In specific embodiments, especially for lighting applications, the terms "light" and "radiation" refer to visible light.

The term UV radiation may in specific embodiments refer to near UV radiation (NUV). Therefore, herein also the term "(N)UV" is applied, to refer to in general UV, and in specific embodiments to NUV. The term IR radiation may in specific embodiments refer to near IR radiation (NIR). Therefore, herein also the term "(N)IR" is applied, to refer to in general IR, and in specific embodiments to NIR.

Herein, the term "visible light" especially relates to light having a wavelength selected from the range of 380-780 nm.

Herein, UV (ultraviolet) may especially refer to a wavelength selected from the range of 190-380 nm, though in specific embodiments other wavelengths may also be possible.

Herein, IR (infrared) may especially refer to radiation having a wavelength selected from the range of 780-3000 nm, such as 780-2000 nm, e.g. a wavelength up to about 1500 nm, like a wavelength of at least 900 nm, though in specific embodiments other wavelengths may also be possible. Hence, the term IR may herein refer to one or more of near infrared (NIR (or IR-A)) and short-wavelength infrared (SWIR (or IR-B)), especially NIR.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE EMBODIMENTS

Laser diodes, such as two laser diodes, may be arranged on the carrier via a holder and illuminate a phosphor tile under an angle of 60°. The laser diodes may be arranged in the vicinity of the phosphor such that a large part of the laser light is directed onto the phosphor. Such a light emitting device can be mounted on a (secondary) heat sink. Laser-phosphor (surface mounted device) SMD can be used in high brightness lighting applications such as adaptive front lighting systems, stage lighting, projection, medical lighting, etc. It appears desirable to improve the spectral and/or spatial light distribution of laser-phosphor SMDs. Amongst others, herein in embodiments a laser SMD package is proposed with transmissive phosphor and using a sapphire light in-coupler for improved collection efficiency and spectral-spatial light distribution. The phosphor (tile) may be arranged on top of a transparent-shaped light in-coupler which may be arranged on top of a reflective heatsink. The angle at which the lasers are arranged and the side surfaces of the transparent-shaped light in-coupler may in embodiments be designed such that laser light is efficiently directed towards (and focused onto) the bottom surface of the phosphor tile. Instead of direct pumping, also indirect phosphor pumping via mirrors can be used to improve focusing of the light onto the phosphor. In addition, in embodiments the side surfaces of the transparent-shaped light in-coupler may comprise a reflector with a pinhole to further improve the efficiency. In specific embodiments, the bottom of the phosphor tile is pumped from multiple sides.

Figure 1A:
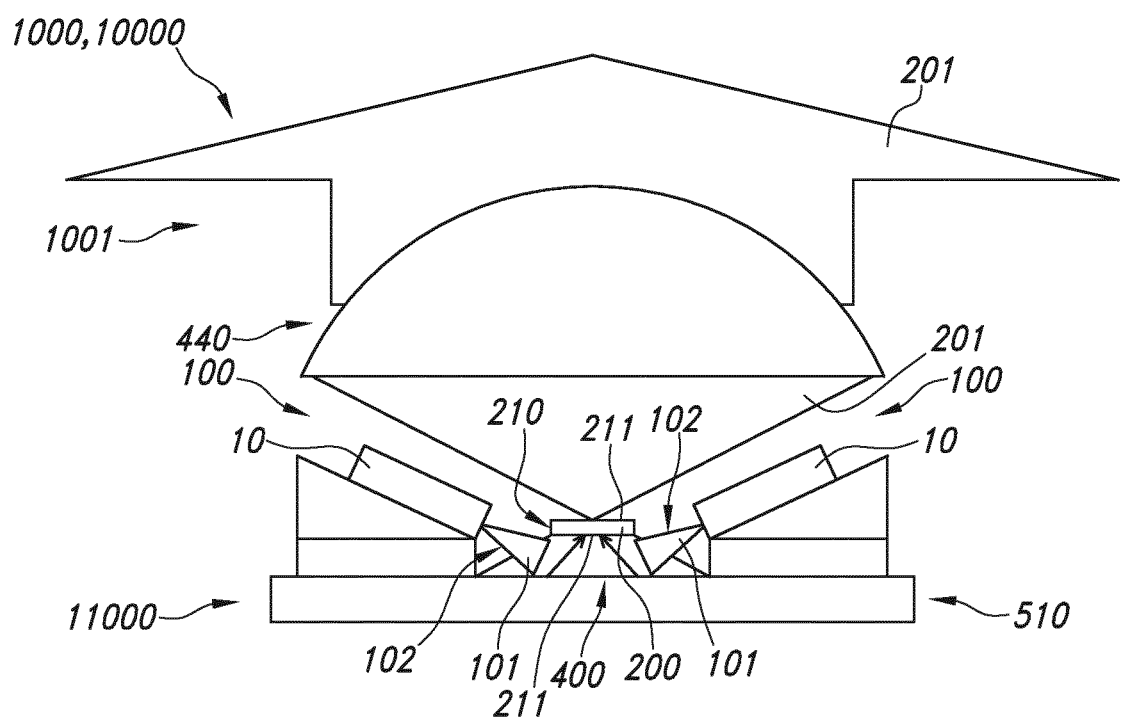
FIGS. 1a-1g schematically depict some embodiments and aspects.

FIG. 1a schematically depicts an embodiment of a light generating system 1000. The system 1000 comprises a lighting unit 100, a luminescent element 210, an optical element 400, and a reflective element 510. The luminescent element 210 comprises a first luminescent element face 211 and a second luminescent element face 212.

The lighting unit 100 is especially configured to generate a beam 102 of unit light 101.

The lighting unit 100 may comprise a light source 10 configured to generate light source light 11. In embodiments, the unit light 101 may comprise at least part of the light source light 11. Further, in embodiments the light source 10 may be selected from the group consisting of a laser diode and a superluminescent diode.

The embodiment schematically depicted in FIG. 1a is an embodiment of the light generating system 1000 comprising a plurality of lighting units 100 configured to irradiate different parts of the third part 423 of the external surface 410.

Further, FIG. 1a schematically also depicts an embodiment of an integrated light source package 10000 comprising the light generating system 1000. The integrated light source package 10000 may comprise a common support member 11000, configured to support directly or via intermediate elements the light source(s) 100, the optical element 400, and the luminescent element 210. The common support member 11000 may in embodiments essentially consist of the reflective element 510 and/or a thermally conductive element 500 (see also below).

The reflective element 510 is configured to reflect unit light 101. In embodiments, the reflective element 510 is specular reflective.

Figure 1B:
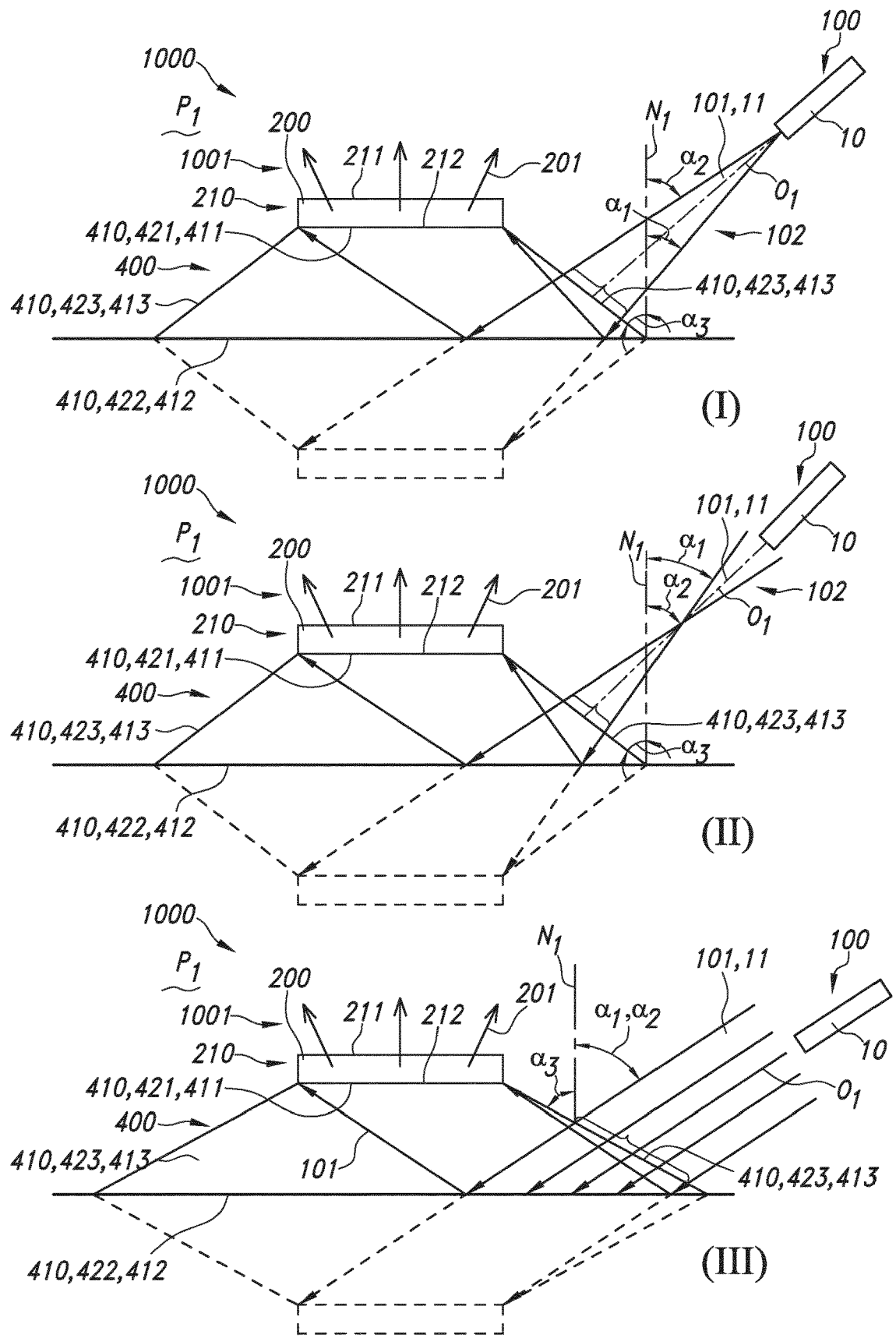

Further aspects of the embodiment and other embodiments are described also with reference to FIG. 1b, wherein a first embodiment I schematically depicts an embodiment wherein the lighting unit 100 provides a divergent beam 102, embodiment II schematically depicts a focused beam 102, and embodiment III schematically depicts a (fully) collimated beam 102.

The luminescent element 210 comprises a luminescent material 200, especially configured to convert at least part of the unit light 101 into luminescent material light 201. The luminescent element 210 comprises a first luminescent element face 211 and a second luminescent element face 212. Especially, at least part of the luminescent material 200 is configured between the first luminescent element face 211 and the second luminescent element face 212. In embodiments, the luminescent material 200 comprise a luminescent material of the type $A_3B_5O_{12}$:Ce, wherein A comprises one or more of Y, La, Gd, Tb and Lu, and wherein B comprises one or more of Al, Ga, In and Sc.

The optical element 400 comprises an external surface 410. Especially, the optical element 400 is configured between the luminescent element 210 and the reflective element 510.

A first part 421 of the external surface 410 may be directed to the second luminescent face 212 and a second part 422 of the external surface 410 may be directed to the reflective element 510. Especially, a third part 423 of the externa surface 410 is configured in a light receiving relationship with the lighting unit 100. Hence, at least part of the third part may receive lighting unit light 101. A first area A1 of the first part 421 may be smaller than a second area A2 of the second part 422. Hence, the area of the first part 421 is indicated with reference A1 and the area of the second part 422 is indicated with reference A2. The optical element 400 is transmissive for the unit light 101. The optical element 400 may be selected from the group consisting of a ceramic body, a single crystal (such as alumina, like e.g. sapphire), glass, and quartz.

The lighting unit 100 is configured such that in an operational mode the lighting unit 100 is configured to irradiate the first element face 211, especially via transmission through the optical element 400 and reflection at the reflective element 510.

In embodiments, the lighting unit 100 may be configured such that in the operational mode the lighting unit 100 is configured to irradiate at least 20% of the second element face 212 via transmission through the optical element 400 and reflection at the reflective element 510.

In embodiments, the lighting unit 100 may be configured such that in the operational mode the lighting unit 100 is configured to irradiate at least 20% of the second part 422 via transmission through the optical element 400, and via reflection at the reflective element 510 (downstream of the second part 422). Further, in embodiments the lighting unit 100 may be configured such that in the operational mode the lighting unit 100 is configured to irradiate at least 70% of the second element face 212.

In embodiments, the optical element 400 may comprise a first face 411 comprising the first part 421, a second face 412 comprising the second part 422, and one or more third faces 413 comprising the third part 423, wherein the first face 411 and the second face 412 are configured parallel, wherein the first face 411 is in physical contact with the luminescent element 210, wherein the second face 412 is in physical contact with the reflective element 510.

Reference 440 refers to an embodiment of (yet) a further optics, like a beam shaping element, such as a lens.

FIGS. 1a and 1b further schematically depict embodiments wherein the third angle α3 is selected from the range of 15-75°, see especially FIG. 1b.

Referring to FIG. 1b, the beam 102 of unit light 101 is selected from the group consisting of a divergent beam, a focused beam, and a collimated beam, see embodiments I-III, respectively.

Figure 1C:
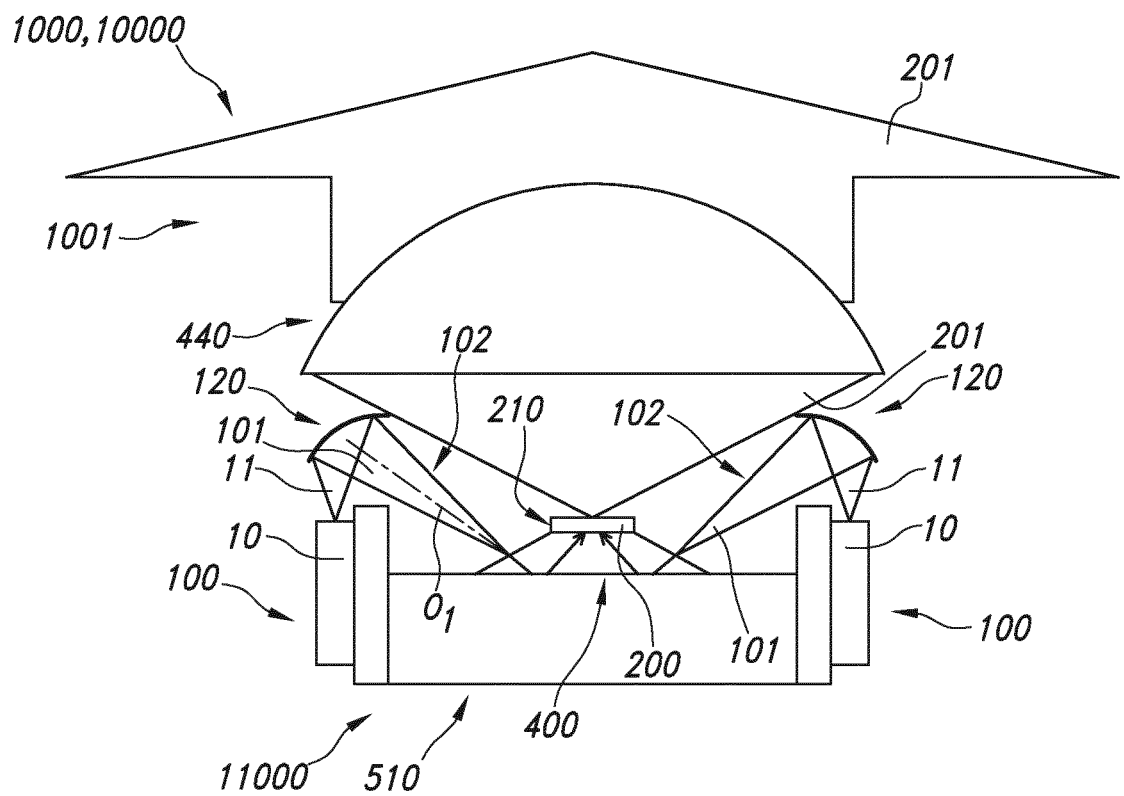

Referring to FIG. 1c, the lighting unit 100 may further comprise one or more second optical elements 120 configured to one or more of (i) shape the beam 102 of unit light 101, and (ii) direct the beam 102 of unit light 101. In specific embodiments, the one or more second optical elements 120 comprise one or more parabolic mirrors.

Figure 1D:
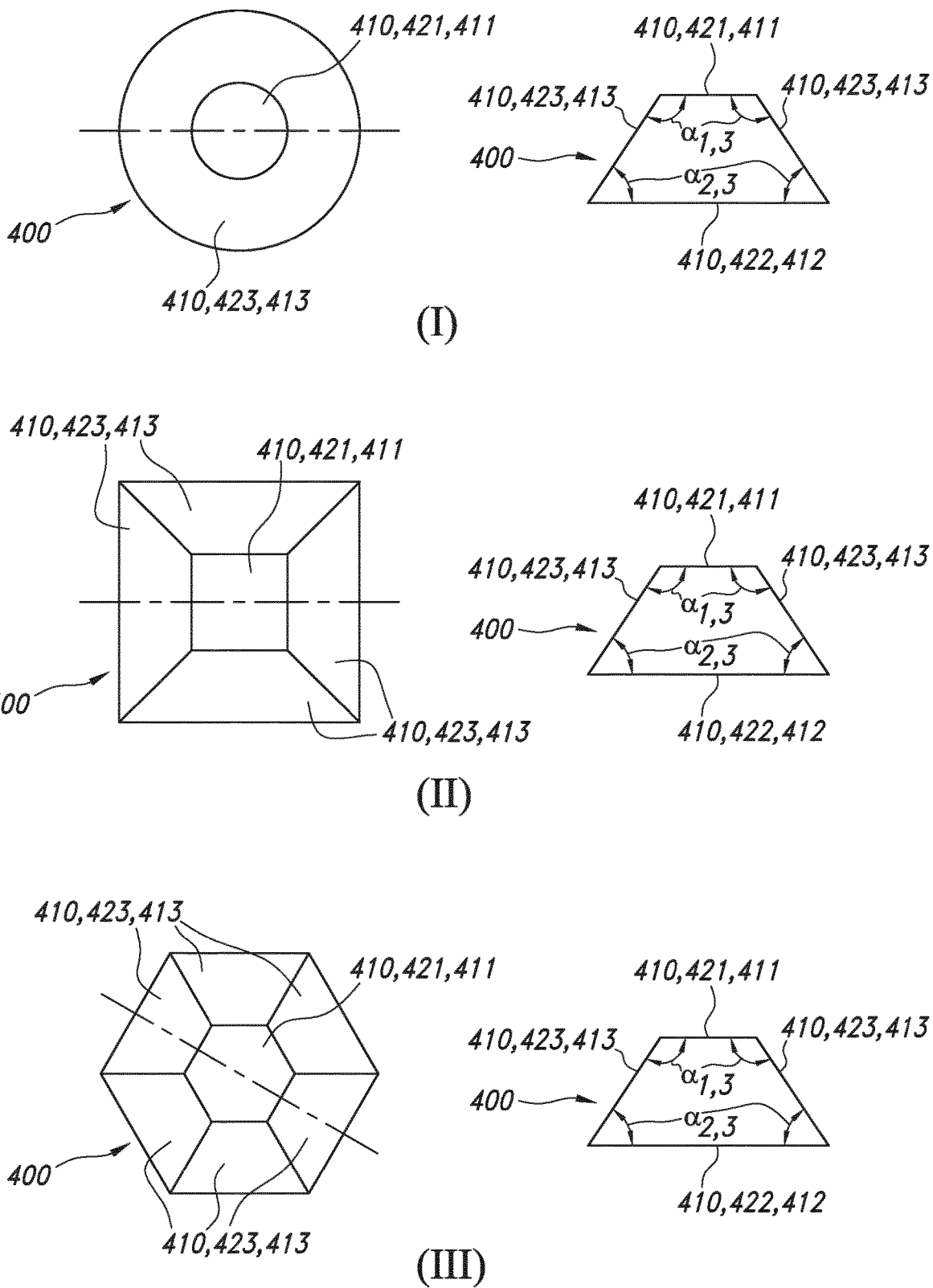

FIG. 1d schematically depicts embodiments wherein the third face 413 and the first face 411 have a first mutual angle $\alpha_{1,3}$, and wherein the third face 413 and the second face 412 have a second mutual angle $\alpha_{2,3}$, wherein $100° \leq \alpha_{1,3} \leq 175°$, and wherein $5° \leq \alpha_{2,3} \leq 80°$.

The optical element 400 may have the shape of a frustum, with one or more edges defined by the one or more third faces 413. In embodiment I, a conical frustum is schematically depicted, in embodiment II a right pyramidal frustum, and in embodiment III a hexagonal pyramidal frustum.

Figure 1E:
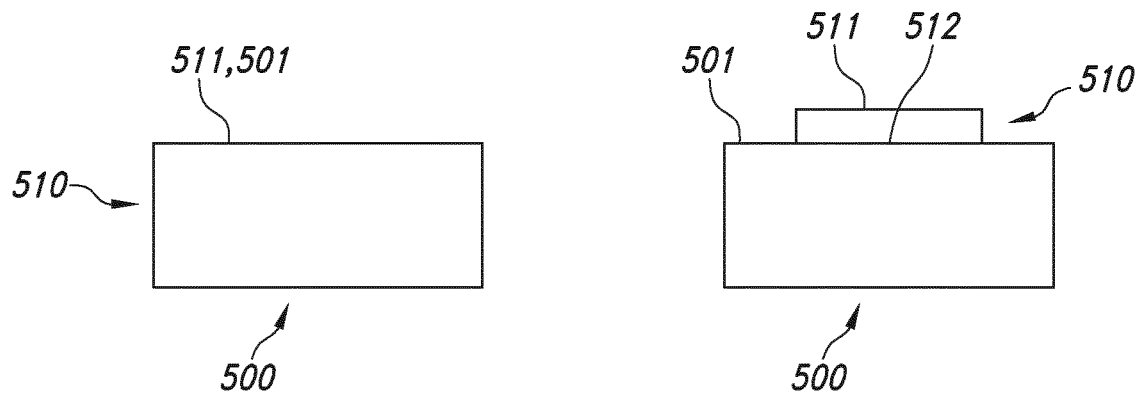

FIG. 1e schematically depicts an embodiment wherein the reflective element 510 and a thermally conductive element 500 are the same element (on the left), and wherein the reflective element 510 may be a layer on the thermally conductive element 500 (on the right). Hence, the light generating system 1000 may comprise a thermally conductive element 500, wherein the reflective element 510 is defined by the thermally conductive element 500 or is configured as reflective layer on the thermally conductive element 500; and wherein the thermally conductive element 500 comprises a heatsink.

Figure 1F:
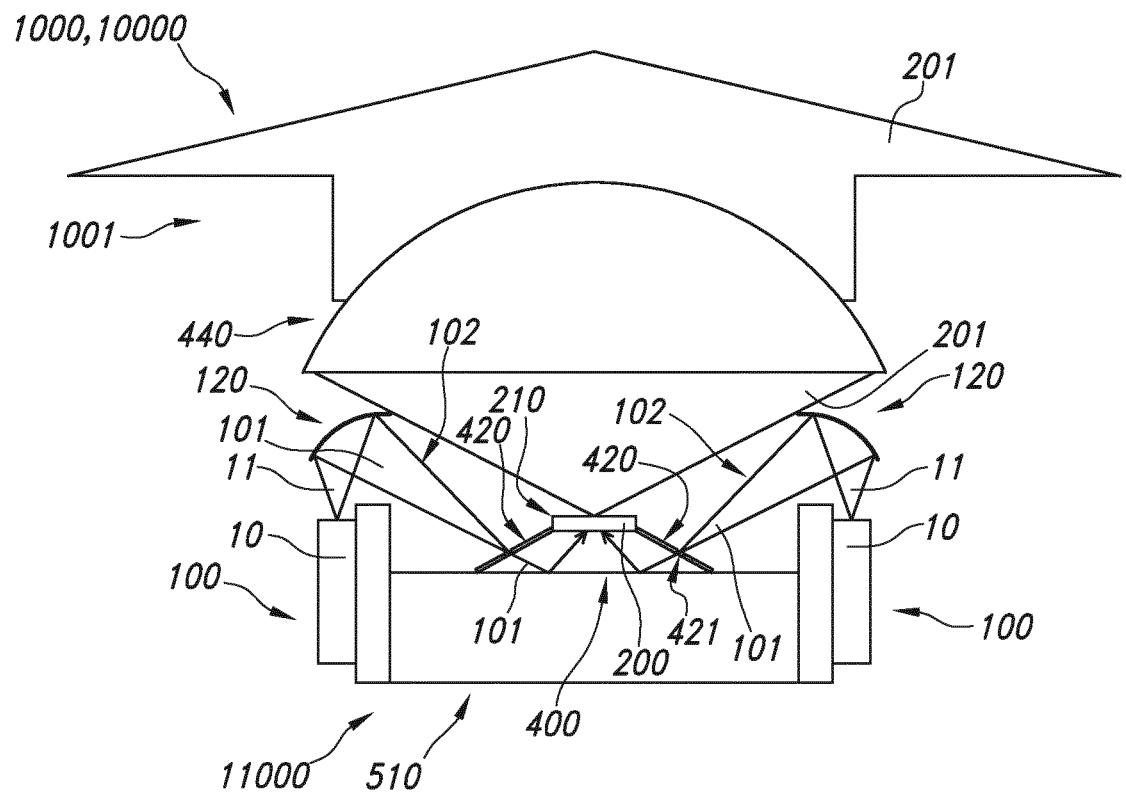

FIG. 1f schematically depicts an embodiment of the light generating system 1000, comprising a second reflective element 420. The second reflective element 420 may be configured to reflect unit light 101 that escapes from the optical element 400 via the one or more third faces 413 back into the optical element 400. The third part 423 may have a third area A3. The one or more third faces 413 may have a fourth area A4. At least 50% of the fourth area A4 may be directed to the second reflective element 420. In embodiments, at maximum 25% of the fourth area A4 may be defined by the third area A3.

Figure 1G:
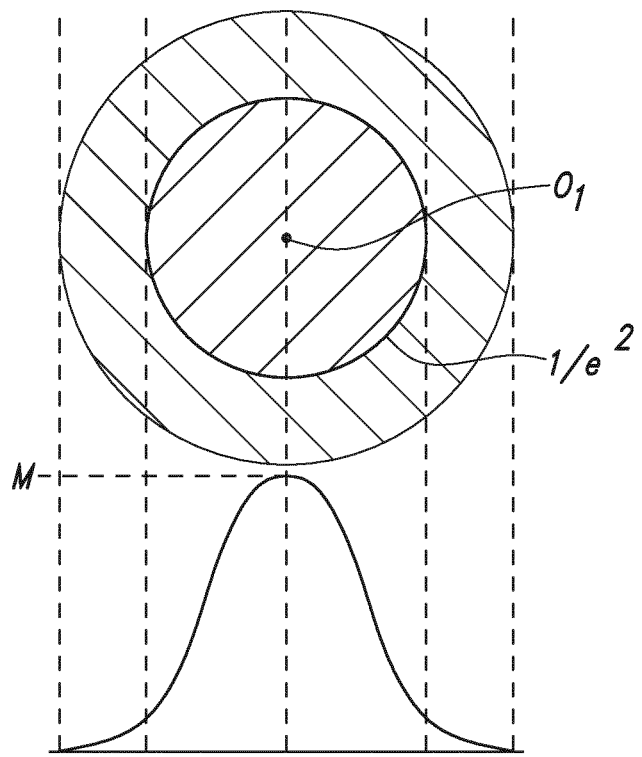

FIG. 1g schematically depicts a cross-sectional view of a beam of light, with an optical axis O1. The optical axis O1 may coincide with the maximum of the spectral power distribution. The inner ring indicates all intensities between 100% of the spectral power (i.e. the maximum spectral power) and $1/e^2*100\%$ of the maximum spectral power. The largest outer ring may e.g. indicate all intensities between 100% of the spectral power and 10% of the maximum spectral power. Reference M indicates the maximum.

Figure 2:
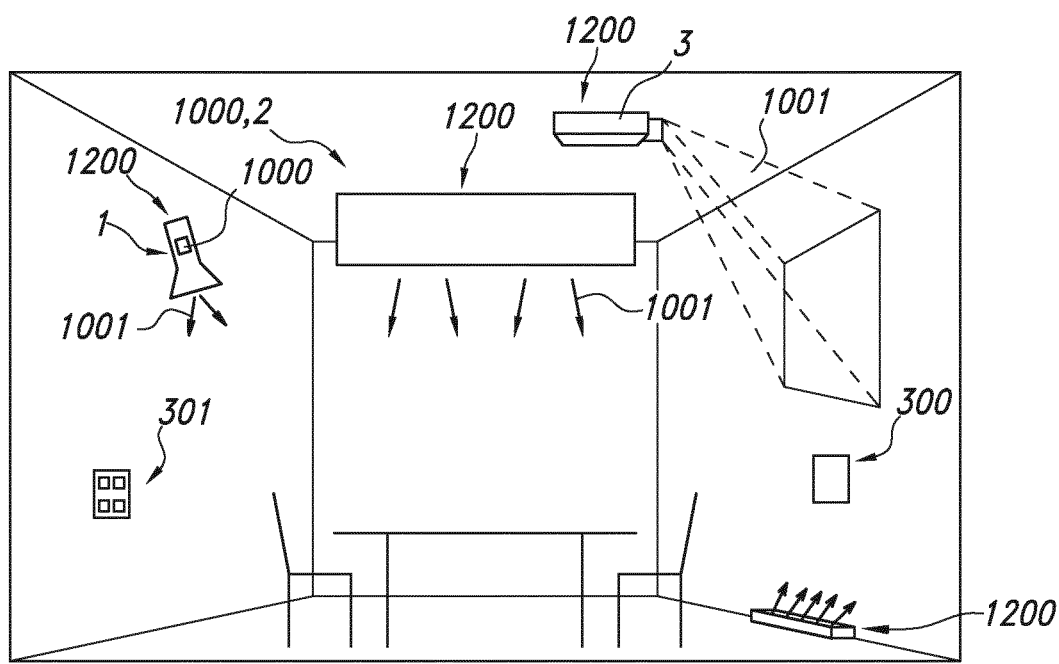
FIG. 2 schematically depicts some applications. The schematic drawings are not necessarily to scale.

FIG. 2 schematically depicts an embodiment of a luminaire 2 comprising the light generating system 1000 as described above. Reference 301 indicates a user interface which may be functionally coupled with the control system 300 comprised by or functionally coupled to the light generating system 1000. FIG. 2 also schematically depicts an embodiment of lamp 1 comprising the light generating system 1000. Reference 3 indicates a projector device or projector system, which may be used to project images, such as at a wall, which may also comprise the light generating system 1000. Reference 1200 refers to a lighting device, which may e.g. be selected from the group of a lamp 1, a luminaire 2, a projector device 3. The lighting device 1200 comprises the light generating device 1000. However, in embodiments the lighting device 1200 may also comprise a disinfection device or an optical wireless communication device (comprising the light generating device 1000). FIG. 2 also schematically depicts an embodiment of the lighting device 1200 comprising a wall light device (such as especially wall washers). The lighting device 1200 may also comprise a cove lighting device (for illuminating a cove).

The term "plurality" refers to two or more. The terms "substantially" or "essentially" herein, and similar terms, will be understood by the person skilled in the art. The terms "substantially" or "essentially" may also include embodiments with "entirely", "completely", "all", etc. Hence, in embodiments the adjective substantially or essentially may also be removed. Where applicable, the term "substantially" or the term "essentially" may also relate to 90% or higher, such as 95% or higher, especially 99% or higher, even more especially 99.5% or higher, including 100%. The term "comprise" also includes embodiments wherein the term "comprises" means "consists of". The article "a" or "an" preceding an element does not exclude the presence of a plurality of such elements.

The term "and/or" especially relates to one or more of the items mentioned before and after "and/or". For instance, a phrase "item 1 and/or item 2" and similar phrases may relate to one or more of item 1 and item 2. The term "comprising" may in an embodiment refer to "consisting of" but may in another embodiment also refer to "containing at least the defined species and optionally one or more other species".

Furthermore, the terms first, second, third and the like in the description and in the claims, are used for distinguishing between similar elements and not necessarily for describing a sequential or chronological order. It is to be understood that the terms so used are interchangeable under appropriate circumstances and that the embodiments of the invention described herein are capable of operation in other sequences than described or illustrated herein.

In the claims, any reference signs placed between parentheses shall not be construed as limiting the claim.

Use of the verb "to comprise" and its conjugations does not exclude the presence of elements or steps other than those stated in a claim. Unless the context clearly requires otherwise, throughout the description and the claims, the words "comprise", "comprising", and the like are to be construed in an inclusive sense as opposed to an exclusive or exhaustive sense; that is to say, in the sense of "including, but not limited to".

The invention may be implemented by means of hardware comprising several distinct elements, and by means of a suitably programmed computer. In a device claim, or an apparatus claim, or a system claim, enumerating several means, several of these means may be embodied by one and the same item of hardware. The mere fact that certain measures are recited in mutually different dependent claims does not indicate that a combination of these measures cannot be used to advantage.

The invention also provides a control system that may control the device, apparatus, or system, or that may execute the herein described method or process. Yet further, the invention also provides a computer program product, when running on a computer which is functionally coupled to or comprised by the device, apparatus, or system, controls one or more controllable elements of such device, apparatus, or system.

The invention further applies to a device, apparatus, or system comprising one or more of the characterizing features described in the description and/or shown in the attached drawings. The invention further pertains to a method or process comprising one or more of the characterizing features described in the description and/or shown in the attached drawings.

The various aspects discussed in this patent can be combined in order to provide additional advantages. Further, the person skilled in the art will understand that embodiments can be combined, and that also more than two embodiments can be combined. Furthermore, some of the features can form the basis for one or more divisional applications.

Amongst others, the invention proposes in specific embodiments a sapphire (or other material) light in-coupler for improved collection efficiency and spectral-spatial light distribution. The phosphor (tile) may be arranged on top of a transparent-shaped light in-coupler which may be arranged on top of a reflective heatsink. The angle at which the lasers are arranged as well as the angles of the side surfaces of the transparent-shaped light in-coupler may especially be designed such that laser light is efficiently directed towards (and focused onto) the bottom surface of the phosphor tile. Instead of direct pumping, in embodiments also indirect phosphor pumping via mirrors can be used which may improve focusing of the light onto the phosphor. In addition, the side surfaces of the transparent-shaped light in-coupler may in specific embodiments comprise a reflector with a pinhole to further improve the efficiency. In specific embodiments, the bottom of the phosphor tile may be pumped from multiple sides.

The light generating system may comprise a lighting unit, a luminescent element, an optical element, and a reflective element. In embodiments, the light generating system may comprise a plurality of lighting units, a single luminescent element, a single optical element, and a single reflective element. In embodiments, the light generating system may comprise one or more lighting units, a single luminescent element comprising two or more luminescent materials, a single optical element, and a single reflective element. In embodiments, the light generating system may comprise (i) a plurality of arrangements, each comprising one or more lighting units, a luminescent element (comprising one or more luminescent materials), a single optical element, and (ii) one or more reflective element.

In embodiments, in operation unit light enters the optical element via the third part, propagates in the direction of the second part, may escape from the second part, and is reflected back into the optical element by the reflective element, and enters again in the optical element via the second part, and propagates to the first part, and may escape from the optical element via the first part and enter the luminescent element. There, at least part of the unit light may be converted into luminescent material light.

The invention claimed is:

1. A light generating system comprising a lighting unit, a luminescent element, an optical element, and a reflective element, wherein:
   the lighting unit is configured to generate a beam of unit light;
   the luminescent element comprises a luminescent material configured to convert at least part of the unit light into luminescent material light; wherein the luminescent element comprises a first luminescent element face and a second luminescent element face, wherein at least part of the luminescent material is configured between the first luminescent element face and the second luminescent element face;
   the optical element comprises an external surface, wherein the optical element is configured between the luminescent element and the reflective element, wherein a first part of the external surface is directed to the second luminescent face, wherein a second part of the external surface is directed to the reflective element, and wherein a third part of the external surface is configured in a light receiving relationship with the lighting unit; wherein a first area A1 of the first part of the external surface of the optical element is smaller than a second area A2 of the second part of the external surface of the optical element, wherein the optical element is transmissive for the unit light;
   the reflective element is configured to reflect unit light; and
   the lighting unit is configured such that in an operational mode the lighting unit is configured to irradiate the first luminescent element face via transmission through the optical element and reflection at the reflective element.

2. The light generating system according to claim 1, wherein the lighting unit is configured such that in the operational mode the lighting unit is configured to irradiate at least 20% of the second part via transmission through the optical element, and via reflection at the reflective element at least 70% of the second element face; wherein the reflective element is specular reflective.

3. The light generating system according to claim 1, wherein the optical element comprises a first face comprising the first part, a second face comprising the second part, and one or more third faces comprising the third part, wherein the first face and the second face are configured parallel, wherein the first face is in physical contact with the luminescent element, wherein the second face is in physical contact with the reflective element, wherein the third face and the first face have a first mutual angle $\alpha_{1,3}$, and wherein the third face and the second face have a second mutual angle $\alpha_{2,3}$, wherein $100° \leq \alpha_{1,3} \leq 175°$, and wherein $5° \leq \alpha_{2,3} \leq 80°$.

4. The light generating system according to claim 1, wherein in a first plane (P1) perpendicular to the second part, relative to a first normal (N1) to the second part and configured in the first plane (P1), the beam has a smallest incidence angle ($\alpha$1) on the third part and a largest incidence angle ($\alpha$2) on the third part, wherein the third part has a third angle ($\alpha$3) with the normal (N1), wherein $\alpha 3 > \alpha 1$, and wherein the beam of unit light is defined by at least $1/e^2$ of a maximum of a spectral power of the unit light.

5. The light generating system according to claim 4, wherein the third angle ($\alpha$3) is selected from the range of 15-75°.

6. The light generating system according to claim 4, wherein the beam of unit light is selected from the group consisting of a focused beam, and a collimated beam.

7. The light generating system according to claim 4, wherein the lighting unit comprises a light source configured to generate light source light, wherein the unit light comprises at least part of the light source light; wherein the light source is selected from the group consisting of a laser diode and a superluminescent diode.

8. The light generating system according to claim 7, wherein the lighting unit further comprises one or more second optical elements configured to one or more of (i) shape the beam of unit light, and (ii) direct the beam of unit light.

9. The light generating system according to claim 4, wherein the optical element has the shape of a frustum.

10. The light generating system according to claim 9, comprising a second reflective element, wherein the second reflective element is configured to reflect unit light that escapes from the optical element via the one or more third faces back into the optical element, wherein the third part has a third area A3, wherein the one or more third faces have a fourth area A4, wherein at least 50% of the fourth area A4 is directed to the second reflective element and wherein at maximum 25% of the fourth area A4 is defined by the third area A3.

11. The light generating system according to claim 4, comprising a thermally conductive element, wherein the reflective element is defined by the thermally conductive element or is configured as reflective layer on the thermally conductive element; and wherein the thermally conductive element comprises a heatsink.

12. The light generating system according to claim 4, wherein the optical element is selected from the group consisting of a ceramic body, a single crystal, glass, and quartz; and wherein the luminescent material comprise a luminescent material of the type $A_3B_5O_{12}$:Ce, wherein A comprises one or more of Y, La, Gd, Tb and Lu, and wherein B comprises one or more of Al, Ga, In and Sc.

13. The light generating system according to claim 4, comprising a plurality of lighting units configured to irradiate different parts of the third part of the externa surface.

14. An integrated light source package comprising the light generating system according to claim 4.

15. A light generating device selected from the group of a lamp, a luminaire, a projector device, a disinfection device, and an optical wireless communication device, comprising the light generating system according to claim 4.

* * * * *